US008142978B2

(12) United States Patent
Aoshima

(10) Patent No.: US 8,142,978 B2
(45) Date of Patent: Mar. 27, 2012

(54) PLANOGRAPHIC PRINTING PLATE PRECURSOR AND PRINTING METHOD USING THE SAME

(75) Inventor: Norio Aoshima, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 680 days.

(21) Appl. No.: 12/119,123

(22) Filed: May 12, 2008

(65) Prior Publication Data

US 2008/0286685 A1 Nov. 20, 2008

(30) Foreign Application Priority Data

May 18, 2007 (JP) ................................ 2007-133219

(51) Int. Cl.
*G03F 1/00* (2006.01)
*G03F 7/00* (2006.01)

(52) U.S. Cl. .................. 430/270.1; 430/281.1; 430/302; 101/450.1; 101/453; 101/463.1

(58) Field of Classification Search ............... 430/270.1, 430/302
See application file for complete search history.

(56) References Cited

U.S. PATENT DOCUMENTS

2006/0063110 A1 3/2006 Kiyoyama et al.

FOREIGN PATENT DOCUMENTS

EP 1 577 090 A2 9/2005
EP 1577090 A2 * 9/2005
EP 1 621 341 A2 2/2006
JP 2938397 B2 6/1999
JP 2001-277740 A 10/2001
JP 2001-277742 A 10/2001
JP 2002-287334 A 10/2002
JP 2005-329708 A 12/2005

* cited by examiner

*Primary Examiner* — Cynthia Kelly
*Assistant Examiner* — Chanceity Robinson
(74) *Attorney, Agent, or Firm* — Birch, Stewart, Kolasch & Birch, LLP

(57) ABSTRACT

The invention provides a planographic printing plate precursor having at least: a support; and an image recording layer that is provided on the support, the image recording layer comprising: an infrared ray absorbing agent (A); a polymerization initiator (B); a polymerizable compound (C); and a compound (D) represented by the following Formula (I).

Formula (I)

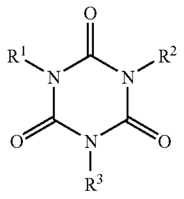

In Formula (I), at least one of $R^1$ to $R^3$ represents $—(CH_2CH_2O)_n—R^4$, while the remainder of $R^1$ to $R^3$ respectively independently represent a hydrogen atom, an alkyl group having 1 to 4 carbon atoms, or $R^5—COOH$; $R^4$ represents a hydrogen atom or an alkyl group having 1 to 4 carbon atoms; n represents an integer of 1 to 20; and $R^5$ represents an alkylene group having 1 to 6 carbon atoms. The invention further provides a printing method using the planographic printing plate precursor and performing on-press development.

20 Claims, No Drawings

PLANOGRAPHIC PRINTING PLATE PRECURSOR AND PRINTING METHOD USING THE SAME

CROSS-REFERENCE TO RELATED APPLICATION

This application claims priority under 35 U.S.C. 119 from Japanese patent Application No. 2007-133219 filed May 18, 2007, the disclosure of which is incorporated by reference herein.

BACKGROUND OF THE INVENTION

Field of the Invention

The present invention relates to a planographic printing plate precursor and a printing method using the same. More specifically, the present invention relates to a planographic printing plate precursor which can record an image by laser and can be on-press developed, and a printing method using the same.

Generally, a planographic printing plate has a configuration having at least a lipophilic image portion for receiving ink in the printing process and a hydrophilic non-image portion for receiving dampening water. Planographic printing is a printing method such that a lipophilic image portion and a hydrophilic non-image portion in a planographic printing plate are used as an ink receiving portion and a dampening water receiving portion (an ink non-receiving portion) respectively by utilizing a property of repulsion of water and oil-based ink with each other, and a difference in adherability of ink is caused on the surface of the planographic printing plate to impress ink on only the image portion and thereafter transfer the ink to an object to be printed such as paper.

Conventionally, a planographic printing plate precursor (PS plate) provided with a lipophilic photosensitive resin layer (an image recording layer) on a hydrophilic support has been widely used in order to produce this planographic printing plate. Ordinarily, a planographic printing plate is obtained by performing plate-making by a method such that a planographic printing plate precursor is exposed to an original image such as a lith film, and thereafter an image recording layer corresponding to an image portion is made to survive, and an unnecessary image recording layer corresponding to a non-image portion is dissolved and removed by alkaline developing solution or organic solvent-containing developing solution, and a hydrophilic support surface is exposed to form a non-image portion.

When making a printing plate from a conventional planographic printing plate precursor, it is necessary to remove undesired portions of the image recording layer through dissolution in a developer or the like after exposure. There has recently been a demand for elimination or simplification of such an additional wet processing. In particular, in recent years, the disposal of waste fluid discharged with wet processing has been a great concern in the whole industrial world in consideration of the terrestrial environment, so that a request to solve the problem has been increasingly strengthened.

Under the circumstance, a so-called on-press development method has been proposed as a simplified platemaking method. In the on-press development method, an image recording layer allowing removal of undesired portions of the image recording layer of the planographic printing plate precursor in the normal printing step is used, and the undesirable portions of image recording layer are removed on-press after exposure.

Specific examples of the on-press development include a method for using a planographic printing plate precursor having an image recording layer capable of being dissolved or dispersed in dampening water, ink solvent or emulsion of dampening water and ink, a method for dynamically removing an image recording layer by contact with rollers and blanket of a printing press, and a method for weakening cohesive force of an image recording layer or adhesive force of an image recording layer and a support by penetration of dampening water and ink solvent to thereafter dynamically remove the image recording layer by contact with rollers and blanket.

In the invention, unless otherwise described, "developing" and "development (process)" mean using an apparatus (typically, an automatic developing machine) other than a printing press to contact an image recording laye with a liquid (typically, alkaline developing solution) so that the image recording layer in an unexposed portion in a planographic printing plate precursor is removed to expose a hydrophilic support surface. The "on-press developing" and "on-press development" mean a method and a process to use a printing press to contact a image recording layer with a liquid (typically, printing ink and/or dampening water) so that the image recording layer in an unexposed portion in a planographic printing plate precursor is removed to expose a hydrophilic support surface.

Digitalization technology of processing, storing, and outputting image information electronically in and out of computer has been widely spreading recently as an image forming means on the planographic printing plate precursor, and various new image-outputting systems compatible with the digitalization technology have been put into practical use. Computer to plate (CTP) technology of producing a planographic printing plate directly without use of a lith film by making a highly converged radiation ray such as laser radiation carry such digitalized image information and scan-irradiating the planographic printing plate precursor with the ray is attracting attention in the above situation. Accordingly, it is one of important technical issues to obtain a planographic printing plate precursor suitable for such technology.

In the simplification, the drying or the process-freeing of plate-making work as described above, an image recording layer after being exposed is not fixed through the development process, thus the image recording layer after being exposed has photosensitivity to bring a possibility of causing fog before printing. Therefore, an image recording layer and a light source capable of being handled in a bright room or under a yellow light are needed.

With regard to such a laser light source, a solid-state laser such as a semiconductor laser or a YAG laser for radiating infrared rays with a wavelength of 760 to 1200 nm is extremely useful for the reason that a high-output and small-sized solid-state laser is available inexpensively. An UV laser may be also used.

Examples of a planographic printing plate precursor subjected to the on-press development for recording an image by this infrared laser include a planographic printing plate precursor having an image forming layer, in which hydrophobic thermoplastic polymer particles are dispersed in a hydrophilic binder, on a hydrophilic support is described in Japanese Patent No. 2938397. It is described in Japanese Patent No. 2938397 that the planographic printing plate precursor is exposed to an infrared laser, and the hydrophobic thermoplastic polymer particles are integrated by heat to form an image, and thereafter the planographic printing plate precursor is mounted on a cylinder of a printing press to be capable of performing the on-press development by dampening water and/or ink.

The method for forming an image with integration of fine particles by mere heat seal in this manner has a problem that image intensity is extremely weak and printing durability is insufficient even though favorable on-press developability is exhibited.

Also, a planographic printing plate precursor having a microcapsule including a polymerizable compound on a hydrophilic support is described in Japanese Patent Application Laid-Open (JP-A) Nos. 2001-277740 and 2001-277742.

Further, a planographic printing plate precursor having a photosensitive layer containing an infrared absorbing agent, a radical polymerization initiator and a polymerizable compound on a support is described in JP-A Nos. 2002-287334 and 2005-329708.

The methods using polymerization reaction in this manner are so high in chemical bonding density of an image portion as compared with an image portion formed by heat seal of polymer fine particles that image intensity is comparatively favorable and favorable printing durability may be exhibited.

However, the methods using polymerization reaction are still insufficient in view of on-press developability. That is to say, the problem is that on-press developability is deteriorated in the case where dampening water is less supplied as compared with the case where dampening water is sufficiently supplied in on-printing press development.

With regard to a conventional planographic printing plate precursor subjected to the on-press development, a removed photosensitive layer component adheres to a dampening roller in a printing press during the development process to cause a problem that dampening water is not uniformly supplied onto a printing plate to deteriorate the quality of printed matter and washability of a dampening roller is deteriorated to increase load of the maintenance.

SUMMARY OF THE INVENTION

The present invention provides a planographic printing plate precursor for use in on-press development, in which favorable on-press developability may be obtained even when little dampening water is supplied, while maintaining sufficient printing durability, and a component removed by development may be inhibited from adhering to a dampening roller in a printing press, and provides a printing method using the planographic printing plate precursor.

Namely, a first aspect of the invention provides a planographic printing plate precursor comprising: a support; and an image recording layer that is provided on the support and is configured to form an image as a result of supply of printing ink and dampening water at a printing press and removal of an unexposed portion after exposure, the image recording layer comprising: an infrared ray absorbing agent (A); a polymerization initiator (B); a polymerizable compound (C); and a compound (D) represented by the following Formula (I):

Formula (I)

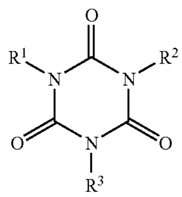

In Formula (I), at least one of $R^1$ to $R^3$ represents $-(CH_2CH_2O)_n-R^4$, while the remainder of $R^1$ to $R^3$ respectively independently represent a hydrogen atom, an alkyl group having 1 to 4 carbon atoms, or $R^5-COOH$; $R^4$ represents a hydrogen atom or an alkyl group having 1 to 4 carbon atoms; n represents an integer of 1 to 20; and $R^5$ represents an alkylene group having 1 to 6 carbon atoms.

In the planographic printing plate precursor of the first aspect of the invention, the content of the compound (D) represented by Formula (I) in the image recording layer is preferably 1 to 20% by mass of the total solid content of the image recording layer.

Further, in the planographic printing plate precursor of the first aspect of the invention, the image recording layer preferably further comprises a polymerizable compound having an isocyanuric acid structure.

Further, a second aspect of the present invention provides a printing method comprising: providing the planographic printing plate precursor of claim 1; imagewise exposing and mounting the planographic printing plate precursor on a printing press, wherein the exposing is performed either before or after the mounting; supplying printing ink and dampening water and performing on-press development of the exposed planographic printing plate precursor so as to form a planographic printing plate having an image formed by removing an unexposed portion of the image recording layer; and printing using the planographic printing plate.

DETAILED DESCRIPTION OF THE INVENTION

The planographic printing plate precursor of the first aspect of the invention 1 has at least: a support; and an image recording layer that is provided on the support and is configured to form an image as a result of supply of printing ink and dampening water at a printing press and removal of an unexposed portion after exposure. The image recording layer comprising: an infrared ray absorbing agent (A); a polymerization initiator (B); a polymerizable compound (C); and a compound (D) represented by Formula (I).

The planographic printing plate precursor of the invention can be used in on-press development by supplying printing ink and dampening water, and can provide favorable on-press developability while maintaining sufficient printing durability even when little dampening water is supplied thereto. Further, a component removed by development may be inhibited from adhering to a dampening roller in a printing press when the planographic printing plate precursor of the invention is used.

The planographic printing plate precursor of the invention may have a configuration in which a protective layer is further provided on the image recording layer that is provided on the support.

Details of the planographic printing plate precursor of the invention are explained hereinafter.

Image Recording Layer

The image recording layer in the planographic printing plate precursor of the invention are described in detail with regard to an embodiment of image formation using thereof the components thereof.

The planographic printing plate precursor of the invention works by being exposed in an imagewise pattern and thereafter subjected to printing by being supplied with dampening water and printing ink without going through development processes such as a wet development process. That is, an image recording layer in a planographic printing plate precursor of the invention is subjected to image formation in the following manner.

First, an image recording layer becomes a printing ink receiving portion having a lipophilic surface by curing an exposed portion. On the other hand, an image recording layer in an unexposed portion is in an uncured state, so that the unexposed portion is dissolved or dispersed for removal by contacting with dampening water and/or printing ink to expose a hydrophilic surface of a support. Thereafter, in a planographic printing plate precursor thus subjected to image formation, dampening water adheres selectively to the hydrophilic surface of the exposed support, and printing ink is impressed on an image recording layer (a printing ink receiving portion) in an exposed area to start printing.

The image recording layer, providing the embodiment of image forming as described above, in the planographic printing plate precursor the invention contains at least the components (A) to (D) and is cured by being exposed to an infrared laser.

The components of an image recording layer in the invention are hereinafter described.

(D) Compound Represented by Formula (I) (Specific Development Promoting Agent)

The image recording layer in the planographic printing plate precursor the invention necessarily contains at least the compound (D) represented by the following Formula (I). Hereinafter, the compound (D) is sometimes referred as a "specific development promoting agent", and details thereof are provided in the following.

Formula (I)

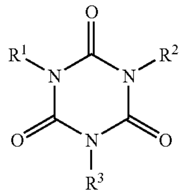

In Formula (I), at least one of $R^1$ to $R^3$ represents $—(CH_2CH_2O)_n—R^4$, while the rest respectively represent a hydrogen atom, an alkyl group having 1 to 4 carbon atoms, or $R^5—COOH$; $R^4$ represents a hydrogen atom or an alkyl group having 1 to 4 carbon atoms; n represents an integer of 1 to 20; and $R^5$ represents an alkyrene group having 1 to 6 carbon atoms.

From the viewpoint of on-press development efficiency, the specific development promoting agent used in the invention preferably has a configuration in which two or more among $R^1$ to $R^3$ are $—(CH_2CH_2O)_n—R^4$ groups, and particularly preferably has a configuration in which three thereamong are all $—(CH_2CH_2O)_n—R^4$ groups. When two or more among $R^1$ to $R^3$ are $—(CH_2CH_2O)_n—R^4$ groups, the values n and the $R^4$s in the $—(CH_2CH_2O)_n—R^4$ groups represented by the two or more among $R^1$ to $R^3$ can be the same or different from each other.

In the case where the $R^4$ is an alkyl group having 1 to 4 carbon atoms, examples of the alkyl group include a methyl group, an ethyl group, an n-propyl group, an isopropyl group, an n-butyl group, an isobutyl group and a tert-butyl group.

From the viewpoint of on-press developability, n is preferably an integer of 1 to 10, and is more preferably an integer of 1 to 3. The $R^4$ is preferably a hydrogen atom or a methyl group, and is particularly preferably a hydrogen atom.

In the case where the $R^1$ to $R^3$ are an alkyl group having 1 to 4 carbon atoms, examples of the alkyl group include a methyl group, an ethyl group, an n-propyl group, an isopropyl group, an n-butyl group, an isobutyl group and a tert-butyl group, and a methyl group and an ethyl group are preferable thereamong.

Preferable examples of the group represented by any of $R^1$ to $R^3$ include $—C_2H_4COOH$ in the case where the any of $R^1$ to $R^3$ represent(s) $R^5—COOH$.

In the invention, the rest of $R^1$ to $R^3$ except the $—(CH_2CH_2O)_n—R^4$ group are preferably respectively a hydrogen atom or a methyl group, and particularly preferably a hydrogen atom.

Specific examples of the specific development promoting agent used in the invention include compounds represented by any one of the following structural formulae (D-1) to (D-10), while the invention is not limited thereto.

In the invention, tris(2-hydroxyethyl)isocyanurate of the structural formula (D-1) is particularly preferable in view of providing a particularly excellent balance between on-press development promotion and printing durability.

(D-1)

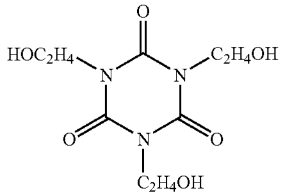

(D-2)

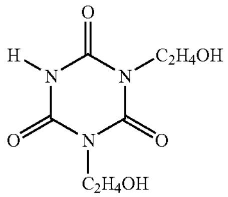

(D-3)

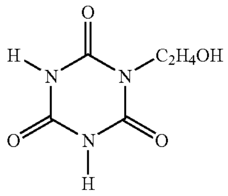

(D-4)

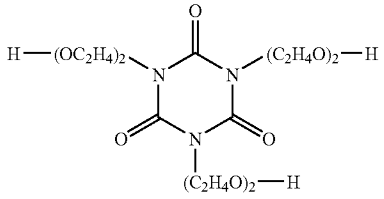

(D-5)

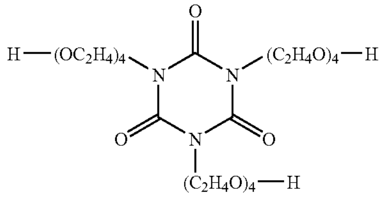

(D-6)

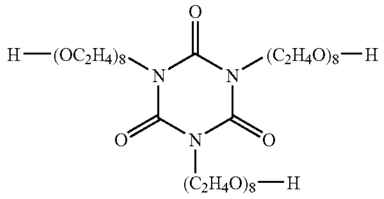

-continued (D-7)

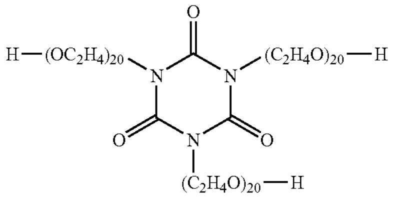

(D-8)

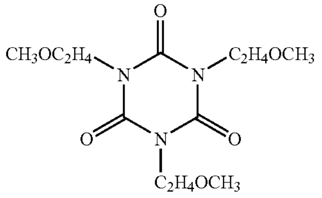

(D-9)

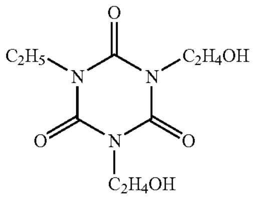

(D-10)

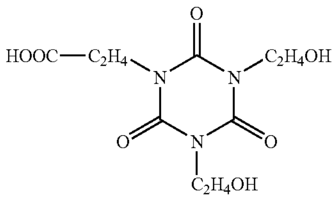

The specific development promoting agent may be used singly or in combination of two or more kinds thereof.

The content of the specific development promoting agent in the image recording layer of the planographic printing plate precursor of the invention is preferably 1 to 20% by mass, more preferably 2.5 to 15% by mass and particularly preferably 5 to 10% by mass of the total solid content of the image recording layer. Too small addition amount thereof causes insufficient on-press developability to the planographic printing plate precursor, while too large addition amount thereof provides excessive hydrophilic property to the image recording layer to cause insufficient printing durability and insufficient inking property.

The specific development promoting agent used in the invention is used particularly preferably in combination with other compounds having an active hydrogen and a highly polar structure such as urethane bond, an urea bond or an isocyanuric acid structure by reason of expressing development promoting action without deteriorating printing durability. The reason therefor is conceived to be that an isocyanuric acid backbone in the specific development promoting agent and the active hydrogen or the highly polar structure can interact with each other to improve film strength of an image portion to be formed in the image forming layer.

Preferable examples of the compounds having active hydrogen or a highly polar structure include a polymerizable compound, a binder polymer, a polymer fine particle and a microcapsule. The interaction of the development promoting agent with any of these components which enable to improve film strength of an image portion provides further enhanced development promoting effect without deteriorating printing durability.

As another effect of the interaction of the specific development promoting agent with the components to improve film strength of the image portion, it can more effectively resolve a problem that a substance which has been removed in on-press development is precipitated in a form of a sediment on a dampening roller to hinder the supply of dampening water. The reason therefor is conceived to be that the dispersibility of the hydrophobic components to improve film strength in dampening water is improved by the interaction of the specific development promoting agent having a hydrophilic isocyanuric acid structure therewith.

(A) Infrared Absorbing Agent

The planographic printing plate precursor of the invention essentially contains at least (A) the infrared absorbing agent. The utilization of (A) the infrared absorbing agent allows image formation by using a laser for emitting infrared rays with a wavelength of 760 to 1200 nm as a light source.

The infrared absorbing agent has the function of converting absorbed infrared rays into heat and the function of performing electron transfer and/or energy transfer to the polymerization initiator (radical generator), which is described in the following, by being excited with infrared rays. The infrared absorbing agent used in the invention is a dye or a pigment having the absorption maximum at a wavelength of 760 to 1200 nm.

Examples of the dye include commercially available dyes and the compounds described in literatures such as "Dye Handbook" (ed. Soc. Synthetic Organic Chemistry, 1970), may be used. Specific examples thereof include dyes azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squarylium colorants, pyrylium salts, or metal thiolate complexes.

Preferable examples of the dye include cyanine dyes such as those described in JP-A Nos. 58-125246, 59-84356, and 60-78787; methine dyes such as those described in JP-A Nos. 58-173696, 58-181690, and 58-194595; naphthoquinone dyes such as those described in JP-A Nos. 58-112793, 58-224793, 59-48187, 59-73996, 60-52940, and 60-63744; squatylium colorants such as those described in JP-A No. 58-112792; and cyanine dyes such as those described in British Patent No. 434,875.

Also preferably used are infrared-absorbing sensitizers such as those described in U.S. Pat. No. 5,156,938; substituted arylbenzo(thio)pyrylium salts such as those described in U.S. Pat. No. 3,881,924; trimethine thiapyrylium salts such as those described in JP-A No. 57-142645 (U.S. Pat. No. 4,327,169); pyrylium compounds such as those described in JP-A Nos. 58-181051, 58-220143, 59-41363, 59-84248, 59-84249, 59-146063, and 59-146061; cyanine colorants such as those described in JP-A No. 59-216146; pentamethine thiopyrylium salts and others such as those described in U.S. Pat. No. 4,283,475; and pyrylium compounds such as those described in JP-B Nos. 5-13514 and 5-19702. Other preferable examples of the dye include infrared-absorbing dyes represented by Formulae (I) or (II) described in U.S. Pat. No. 4,756,993.

Yet other preferable examples of the photoabsorbing material used in the invention include the specific indolenine cyanine colorants described in JP-A No. 2002-278057, whose examples are shown below.

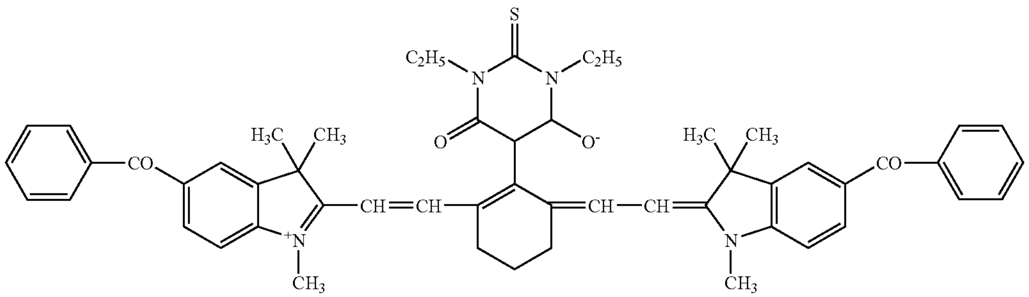

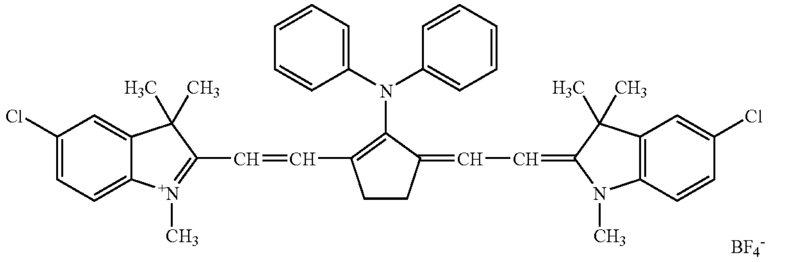

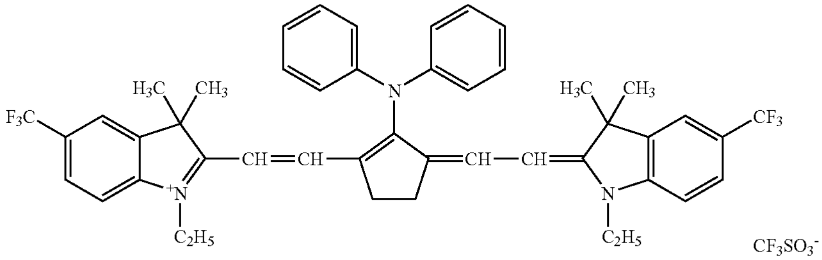

Particularly preferable examples among the dyes include cyanine dyes, squarylium dyes, pyrylium salts, nickel thiolate complexes, and indolenine cyanine dyes. Cyanine dyes and indolenine cyanine dyes are more preferable, and cyanine dyes represented by the following Formula (i) are particularly preferable.

Formula (i)

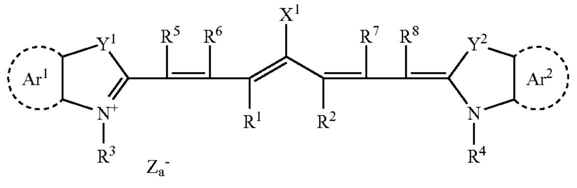

In Formula (i), $X^1$ represents a hydrogen atom, a halogen atom, —$NPh_2$, $X^2$-$L^1$ or the group shown below. In the Formula, $X^2$ represents an oxygen atom, a nitrogen atom, or a sulfur atom; and $L^1$ represents a hydrocarbon group having 1 to 12 carbon atoms, a heteroatom-containing aromatic ring, or a heteroatom-containing hydrocarbon group having 1 to 12 carbon atoms. The "heteroatom" means a nitrogen atom, a sulfur atom, an oxygen atom, a halogen atom, or a selenium atom. In the group shown below, $X_a^-$ has the same definition as $Z_a^-$ described below; and $R^a$ represents a substituent selected from a hydrogen atom, an alkyl group, an aryl group, a substituted and unsubstituted amino group, and a halogen atom.

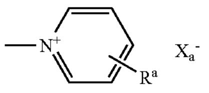

In Formula (i), $R^1$ and $R^2$ each independently represent a hydrocarbon group having 1 to 12 carbon atoms. From the point of the storage stability of the image recording layer coating liquid, $R^1$ and $R^2$ respectively preferably represent a hydrocarbon group having two or more carbon atoms. In a particularly preferable embodiment, $R^1$ and $R^2$ bind to each other to form a five- or six-membered ring.

$Ar^1$ and $Ar^2$ may be the same as or different from each other, and each independently represent an aromatic hydrocarbon group which may have a substituent. Preferable examples of the aromatic hydrocarbon group include benzene rings and naphthalene rings. Preferable examples of the substituent include hydrocarbon groups having 12 or fewer carbon atom(s), halogen atom(s), and alkoxy groups having 12 or fewer carbon atom(s). $Y^1$ and $Y^2$ may be the same as or different from each other, and each independently represent a sulfur atom or a dialkylmethylene group having 12 or fewer carbon atoms. $R^3$ and $R^4$ may be the same as or different from each other, and each independently represent a hydrocarbon group having 20 or fewer carbon atoms that may have a substituent. Preferable examples of the substituent thereon include alkoxy groups having 12 or fewer carbon atoms, a carboxyl group, and a sulfo group. $R^5$, $R^6$, $R^7$ and $R^8$ may be the same as or different from each other, and each independently represent a hydrogen atom or a hydrocarbon group having 12 or fewer carbon atoms. Each of $R^5$, $R^6$, $R^7$ and $R^8$ preferably represents a hydrogen atom, from the point of availability of the raw material. $Z_a^-$ represents a counter anion. However, when the cyanine colorant represented by Formula (i) has an anionic substituent in the structure and there is no need for neutralization of the electric charge, $Z_a^-$ is unnecessary. From the point of the storage stability of the image recording layer coating liquid, $Z_a^-$ preferably represents a halogen ion, a perchloric acid ion, a tetrafluoroborate ion, a hexafluorophosphate ion, or a sulfonic acid ion, and particularly preferably represents a perchloric acid ion, a hexafluorophosphate ion, or an aryl sulfonic acid ion.

Specific examples of the cyanine colorants represented by Formula (i) preferably used in the invention include those described in JP-A No. 2001-133969, paragraph numbers 0017 to 0019.

Other preferable examples thereof include the above-mentioned specific indolenine cyanine colorants described in JP-A No. 2002-278057.

Examples of the pigment usable in the invention include commercially available pigments and the pigments described in Color Index (C.I.) Handbook, "Latest Pigment Handbook" (Japan Society of pigment technologies Ed., 1977), "Latest Pigment Application Technologies" (CMC Publishing, 1986), and "Printing Ink Technology" (CMC Publishing, 1984).

Examples of the pigments include black pigments, yellow pigments, orange pigments, brown pigments, red pigments, purple pigments, blue pigments, green pigments, fluorescent pigments, metal powder pigments, as well as polymer-bound colorants. Specific examples thereof include insoluble azo pigments, azolake pigments, condensation azo pigments, chelate azo pigments, phthalocyanine pigments, anthraquinone-based pigments, perylene pigments, perynone pigments, thioindigo pigments, quinacridone pigments, dioxazine pigments, isoindolinone pigments, quinophtharone pigments, dyed lake pigments, azine pigments, nitroso pigments, nitro pigments, natural pigments, fluorescent pigments, inorganic pigments, and carbon black. Among these pigments, carbon black is preferable.

These pigments may be used either with or without surface treatment. Examples of the surface treatment methods include methods of coating a resin or wax on the surface of pigment; methods of attaching a surfactant thereon; and methods of binding a reactive substance (e.g., a silane coupling agent, epoxy compound, polyisocyanate, or the like) to the surface of the pigment. The surface treatment methods above are described in "Properties and Applications of Metal Soaps" (Saiwai Shobo), "Printing Ink Technologies" (CMC Publishing, 1984) and "Latest Pigment Application Technologies" (CMC Publishing, 1986).

The particle diameter of the pigment is preferably in the range of 0.01 to 10 μm, more preferably of 0.05 to 1 μm, and particularly preferably of 0.1 to 10 μm. Within the range above, satisfactory dispersion quality of the pigment in the image recording layer coating liquid, and excellent uniformity of the image recording layer are achieved.

The method for dispersing the pigment may be any one of the dispersion techniques known in the art and used for production of inks, toners, and the like. Suitable dispersing machines include an ultrasonic dispersing machine, a sand mill, an attriter, a pearl mill, a super mill, a ball mill, an impeller, a disperser, a KD mill, a colloid mill, a dynatron, a three roll mill, and a pressurized kneader. More detailed description on such dispersing machines is found in the "Latest Pigment Application Technologies" (CMC Publishing, 1986).

The photoabsorbing material may be added to the same layer containing other components or to a layer separate from the layer containing other components. The photoabsorbing material may be added during production of a negative planographic printing plate precursor such that the absorbance of the image recording layer at the maximum absorption wavelength in the wavelength range of 760 to 1,200 nm, as determined by a reflection measurement method, falls in the range of 0.3 to 1.2, preferably in the range of 0.4 to 1.1. Within the range above, the polymerization reaction progresses uniformly in the depth direction of the image recording layer, so that the image portion has favorable film strength and favorable adhesiveness to the support.

The absorbance of the image recording layer can be adjusted by the amount of the Infrared absorbing agent added to the image recording layer and the thickness of the image recording layer. The absorbance can be determined by an ordinary method. The measurement method may be a method including formin, on a reflective support such as of aluminum, a recording layer having a post-drying coating amount that is adequately selected within a suitable range for a planographic printing plate and measuring the reflection density thereof with an optical densitometer, a method of measuring the reflection density with a spectrophotometer using an integrating sphere, or the like.

The amount of the photoabsorbing material to be added to the image recording layer is preferably 0.1 to 10 wt %, and is more preferably 0.5 to 5 wt %, with respect to the amount of the total solid contents in the image forming layer of the planographic printing plate precursor of the invention.

(B) Polymerization Initiator

The (B) polymerization initiator (radical polymerization initiator) is a compound that generates a radical by light, heat, or both and initiates and promotes polymerization of the (C) polymerizable compound. Examples of the polymerization initiator usable in the invention include known thermal polymerization initiators, compounds containing a bond having a small bond dissociation energy, and photopolymerization initiators.

Examples of the radical generating compound include organic halides, carbonyl compounds, organic peroxide compounds, azo-based polymerization initiators, azide compounds, metallocene compounds, hexaarylbiimidazole compounds, organic borate compounds, disulfonic acid compounds, oxime ester compounds, and onium salt compounds.

Specific examples of the organic halides include the compounds described in Wakabayashi et al., "Bull Chem. Soc Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243, and 63-298339, and M. P. Hutt, "Journal of Heterocyclic Chemistry", 1 (No. 3), (1970)"; and particularly preferable are oxazole compounds substituted by a trihalomethyl group, and S-triazine compounds.

More preferable examples of the organic halides include s-triazine compounds and oxidiazole compounds having at least one mono-, di-, or tri-halogen-substituted methyl group.

Specific examples thereof include: 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluorometjylphenyl)-4,6-bis(trichloromethyl)-s-triazine, 2-(2,6-dichlorophenyl)-4,6-bis(trichloromethyl)-s-triazine, 2-(2,6-dichlromophenyl)-4,6-bis(trichloromethyl)-s-triazine, 2-(4-biphenylyl)-4,6-bis(trichloromethyl)-s-triazine, 2-(4'-chrolo-4-biphenylyl)-4,6-bis(trichloromethyl)-s-triazine, 2-(p-cyanophenyl)-4,6-bis(trichloromethyl)-s-triazine, 2-(p-acetylphenyl)-4,6-bis(trichloromethyl)-s-triazine, 2-(p-ethoxycarbonylphenyl)-4,6-bis(trichloromethyl)-s-triazine, 2-(p-phenoxycarbonylphenyl)-4,6-bis(trichloromethyl)-s-triazine, 2-(p-methylsulfonylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6-bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, 2-(o-methoxystyryl)-5-trichloromethyl-1,34-oxadiazole, 2-(3,4-epoxystyryl)-5-trichloromethyl-1,3,4-oxadiazole, 2-[1-phenyl-2-(4-methoxystyryl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole, and 2-(p-t-butoxystyryl)-5-trichloromethyl-1,3,4-oxadiazole.

Examples of the carbonyl compounds include: benzophenone; benzophenone compounds such as Michler's ketone, 2-methylbenzophenone, 3-methylbenzophenone, 4-methylbenzophenone, 2-chlorobenzophenone, 4-bromobenzophenone, or 2-carboxybenzophenone;

acetophenone compounds such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl) ketone, 1-hydroxy-1-(p-dodecylphenyl)ketone, 2-methyl-(4'-(methylthio)phenyl)-2-morpholino-1-propanone, or 1,1,1-trichloromethyl-(p-butylphenyl)ketone;

thioxanthone compounds such as thioxanthone, 2-ethylthioxanthone, 2-isopropylthioxanthone, 2-chlorothioxanthone, 2,4-dimethylthioxanthone, 2,4-diethylthioxanthone, or 2,4-diisopropylthioxanthone; and benzoate ester compounds such as ethyl p-dimethylaminobenzoate or ethyl p-diethylaminobenzoate.

Examples of the azo compounds include the azo compounds described in JP-A No. 8-108621.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy) butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, persuceinic acid, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, teit-butyl peroxypivalate, tert-butyl peroxyneodecanoate, tert-butyl peroxyoctanoate, tert-butyl peroxylaurate, tercil carbonate, 3,3',4,4'-tetra-(t-butyl peroxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl-di(t-butylperoxydihydrogen diphthalate), and carbonyl-di(t-hexylperoxydihydrogen diphthalate).

Examples of the azide compounds include 2,6-bis(4-azidobenzylidene)-4-methylcyclohexanone.

Examples of the metallocene compounds include: various titanocene compounds described in JP-A Nos. 59-152396, 61-151197, 63-41484, 2-249, 2-4705, and 5-83588 such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, and di-methylcyclopentadienyl-Ti-bis-2,3,4,5,6-pentafluorophen-1-yl; and the iron-arene complexes described in JP-A Nos. 1-304453 and 1-152109.

Examples of the hexaarylbiimidazole compounds include various compounds described, for example, in JP-B No. 6-29285, U.S. Pat. Nos. 3,479,185, 4,311,783, and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4', 5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic borate salt compounds include the organic borate salts described, for example, in JP-A Nos. 62-143044, 62-150242, 9-188685, 9-188686, 9-188710, 2000-131837, and 2002-107916, Japanese Patent 2764769, JP-A No. 2002-116539, and Kunz, Martin, "Rad Tech '98. Proceeding Apr. 19-22, 1998, Chicago"; the organic boron sulfonium complexes or organic boron oxosulfonium complexes described in JP-A Nos. 6-157623, 6-175564, and 6-175561; the organic boron iodonium complexes described in JP-A Nos. 6-175554 and 6-175553; the organic boron phosphonium complexes described in JP-A No. 9-188710; the organic boron transition metal coordination complexes described in JP-A Nos. 6-348011, 7-128785, 7-140589, 7-306527, and 7-292014.

Examples of the disulfonated compounds include the compounds described in JP-A Nos. 61-166544 and 2003-328465.

Examples of the oxime ester compounds include the compounds described in J.C.S. Perkin II (1979) 1653-1660, J.C.S. Perkin II (1979) 156-162, Journal of Photopolymer Science and Technology (1995) 202-232, JP-A Nos. 2000-66385 and 2000-80068, and specific examples thereof include the compounds represented by the following structural formulae.

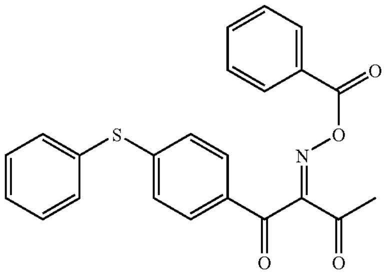
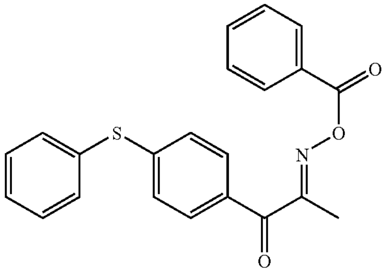
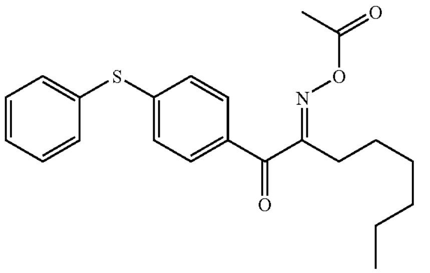
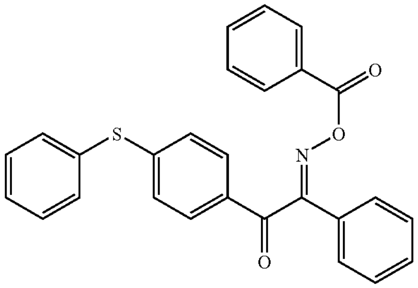
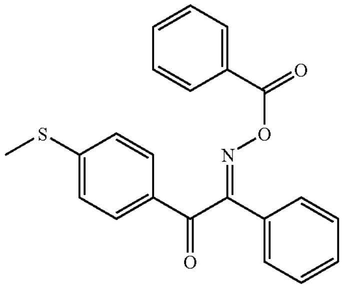
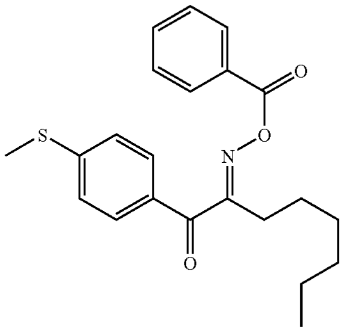
-continued
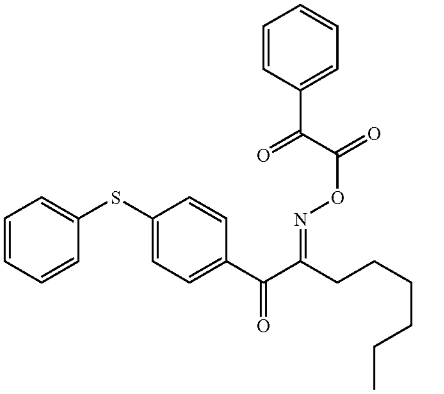
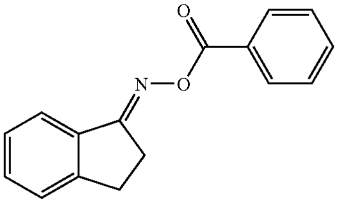
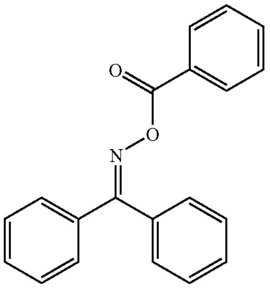
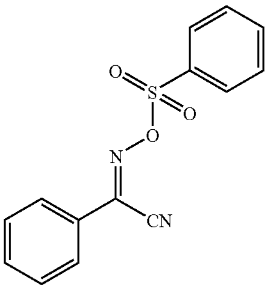
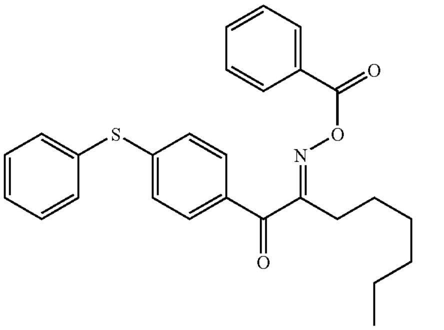

-continued

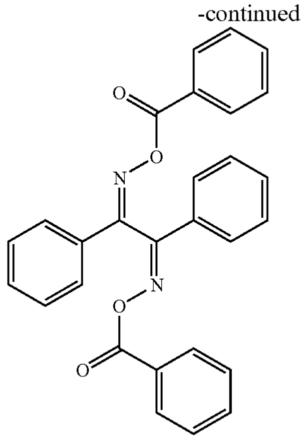

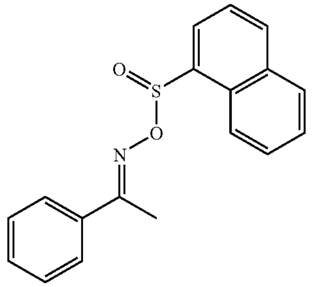

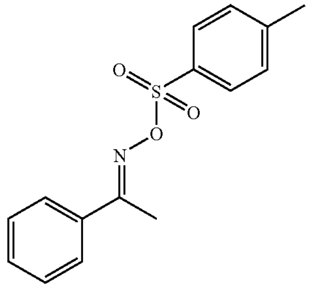

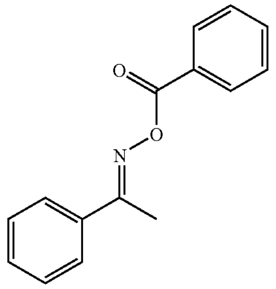

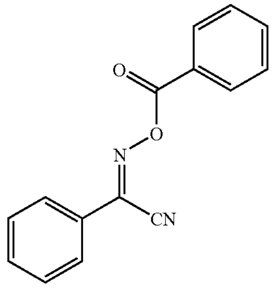

-continued

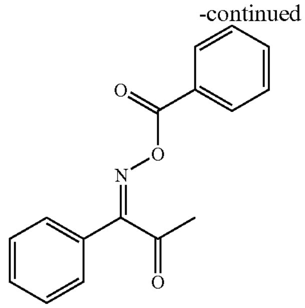

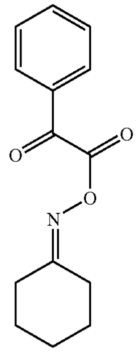

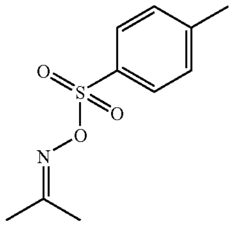

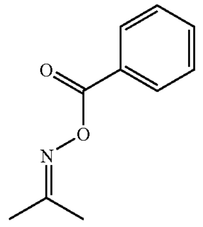

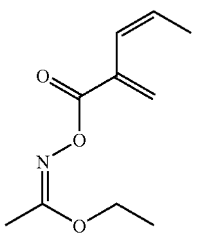

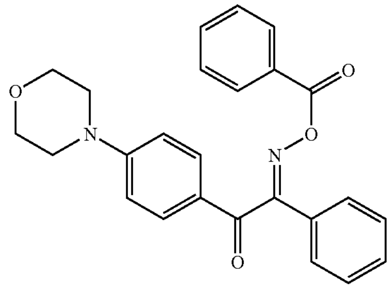

Examples of the onium salt compounds include the diazonium salts described in S. I. Schlesinger, Photogr. Sci. Eng., 18, 387 (1974), T. S. Bal et al., Polymer, 21, 423 (1980); the ammonium salts described in U.S. Pat. No. 4,069,055, JP-A No. 4-365049, and others; the phosphonium salts described in U.S. Pat. Nos. 4,069,055 and 4,069,056; the iodonium salts described in EP Patent No. 104,143, U.S. Pat. Nos. 339,049 and 410,201, JP-A Nos. 2-150848 and 2-296514; the sulfonium salts described EP Patent Nos. 370,693, 390,214, 233,567, 297,443, and 297,442, U.S. Pat. Nos. 4,933,377, 161,811, 410,201, 339,049, 4,760,013, 4,734,444, and 2,833,827, and Germany Patent No. 2,904,626, 3,604,580, and 3,604,581; the selenonium salts described in J. V. Crivello et al., Macromolecules, 10 (6), 1307 (1977), J. V. Crivello et al., J. Polymer Sci., Polymer Chem. Ed., 17, 1047 (1979); the arsonium salts described in C. S. Wen et al., Teh, Proc. Conf. Rad. Curing ASIA, p. 478 Tokyo, October (1988); and the like.

The oxime ester compounds, diazonium salts, iodonium salts, and sulfonium salts above are particularly preferable from the points of reactivity and stability. The onium salt functions not as an acid generator but as an ionic radical-polymerization initiator in the invention.

The onium salt used in the invention is preferably selected from those represented by the following Formulae (RI-I) to (RI-III).

(RI-I)

$$Ar^{11}—N^{+}\equiv N \quad Z^{11-}$$

(RI-II)

$$Ar^{21}—I^{+}—Ar^{22} \quad Z^{21-}$$

(RI-III)

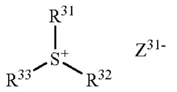

In Formula (RI-I), $Ar^{11}$ represents an aryl group having 20 or fewer carbon atoms that may have one to six substituents, and preferable examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl groups, a cyano group, a sulfonyl group, thioalkyl groups having 1 to 12 carbon atoms, and thioaryl groups having 6 to 12 carbon atoms. $Z^{11-}$ represents a monovalent anion, and specific examples thereof include halide ions, a perchlorate ion, a hexafluorophosphate ion, a tetrafluoroborate ion, a sulfonate ion, a sulfinate ion, a thiosulfonate ion, and a sulfate ion. Among them, perchlorate, hexafluorophosphate, tetrafluoroborate, sulfonate and sulfinate ions are preferable from the point of stability.

In Formula (RI-II), $Ar^{21}$ and $Ar^{22}$ each independently represent an aryl group having 20 or fewer carbon atoms that may have one to six substituents, and preferable examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 6 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl group, a cyano group, a sulfonyl group, thioalkyl groups having 1 to 12 carbon atoms, and thioaryl groups having 6 to 12 carbon atoms. $Z^{21-}$ represents a monovalent anion, specifically a halide, perchlorate, hexafluorophosphate, tetrafluoroborate, sulfonate, sulfinate, thiosulfonate, or sulfate ion; and preferable from the points of stability and reactivity is a perchlorate, hexafluorophosphate, tetrafluoroborate, sulfonate, sulfinate, or carboxylate ion.

In Formula (RI-II), $R^{31}$, $R^{32}$ and $R^{33}$ each independently represent an aryl, alkyl, alkenyl, or alkynyl group having 20 or fewer carbon atoms that may have one to six substituents. Preferable among them from the points of reactivity and stability is an aryl group. Examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl group, a cyano group, a sulfonyl group, thioalkyl groups having 1 to 12 carbon atoms, and thioaryl group having 6 to 12 carbon atoms. $Z^{31-}$ represents a monovalent anion. Specific examples thereof include halide ions, a perchlorate ion, a hexafluorophosphate ion, a tetrafluoroborate ion, a sulfonate ion, a sulfinate ion, a thiosulfonate ion, and a sulfate ion. Among them, perchlorate, hexafluorophosphate, tetrafluoroborate, sulfonate, sulfinate, and carboxylate ions are preferable from the points of stability and reactivity. More preferable examples thereof include the carboxylate ions described in JP-A No. 2001-343742, and particularly preferable examples thereof include the carboxylate ions described in JP-A No. 2002-148790.

Specific examples of the onium salt compounds preferably used in the invention are shown below, while the examples should not be construed as limiting the invention.

(N-1)

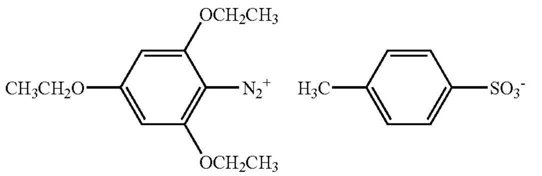

(N-2)

$PF_6^-$ (N-3)

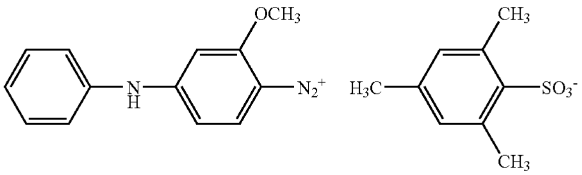

(N-4)

$ClO_4^-$ (N-5)

$PF_6^-$ (N-6)

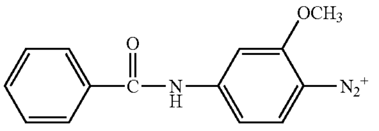

$CF_3SO_3^-$ (N-7)

$BF_4^-$ (N-8)

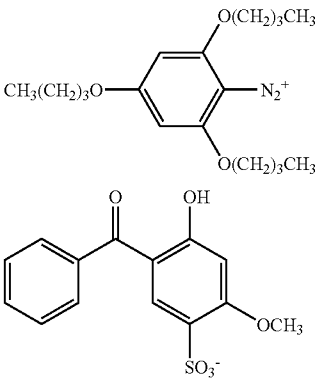

(N-9)

$ClO_4^-$

-continued
(N-10)
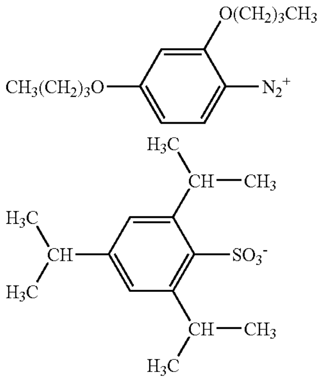
(N-11)
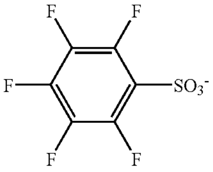
(N-12)
$PF_6^-$
(N-13)
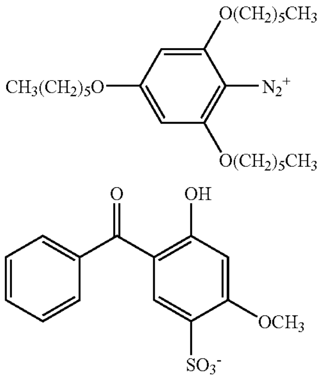
(N-14)
$ClO_4^-$
(N-15)
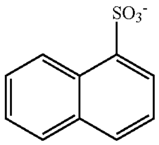
(N-16)
$PF_6^-$
(N-17)
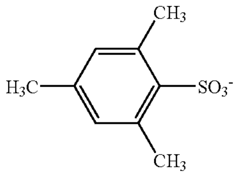
(I-1)
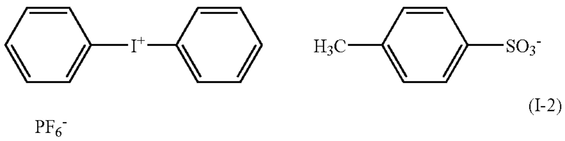
(I-2)
$PF_6^-$
-continued
(I-3)
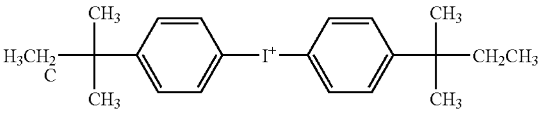
$PF_6^-$
(I-4)
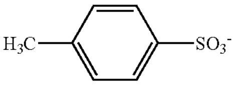
(I-5)
$ClO_4^-$
(I-6)
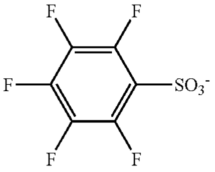
(I-7)
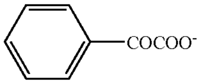
(I-8)
$CF_3SO_3^-$
(I-9)
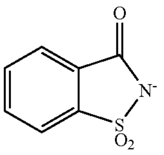
(I-10)
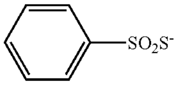
(I-11)
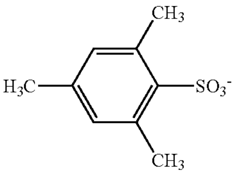
(I-12)
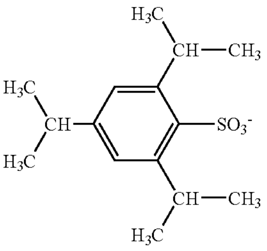
(I-13)
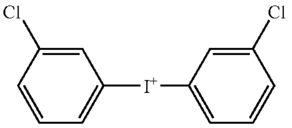
$BF_4^-$
(I-14)
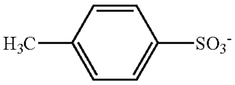

-continued
(I-15)
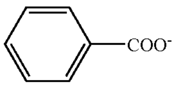
(I-16)
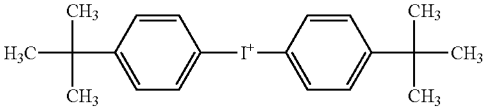
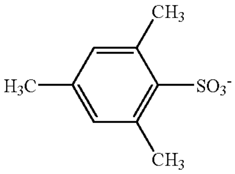
(I-17)
$ClO_4^-$
(I-18)
$PF_6^-$
(I-19)
$C_4F_9SO_3^-$
(I-20)
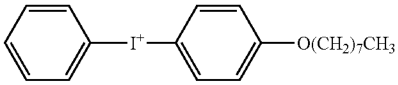
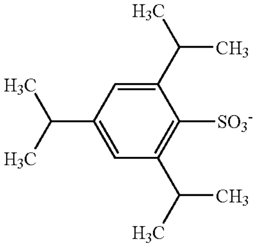
(I-21)
$CF_3COO^-$
(I-22)
$CF_3SO_3^-$
(I-23)
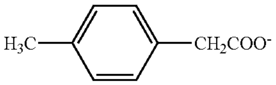
(I-24)
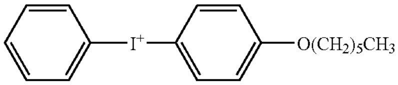
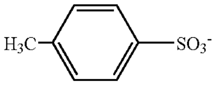
(I-25)
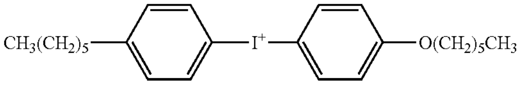
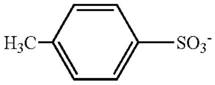
(I-26)
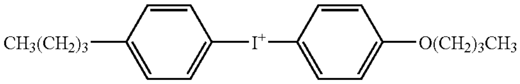
$C_4F_9COO^-$
-continued
(I-27)
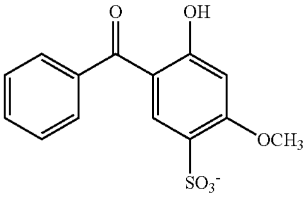
(I-28)
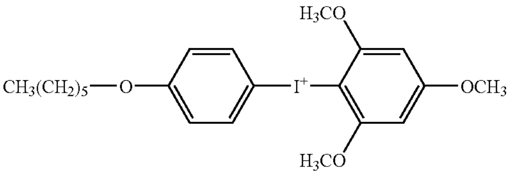
$PF_6^-$
(I-29)
$ClO_4^-$
(I-30)
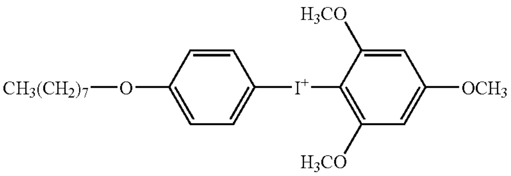
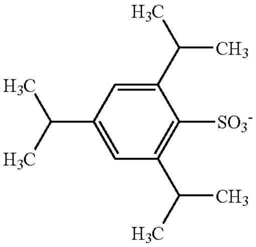
(I-31)
$PF_6^-$
(I-32)
$C_4F_9SO_3^-$
(I-33)
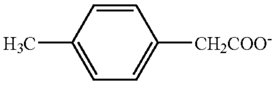
(I-34)
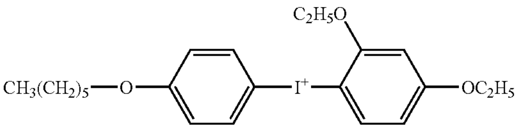
$BF_4^-$
(I-35)
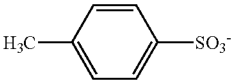
(I-36)
$PF_6^-$
(I-37)
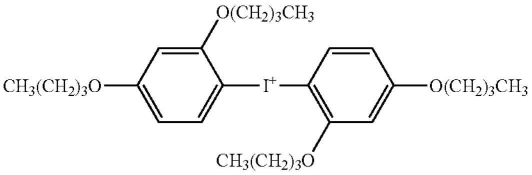
$PF_6^-$
(I-38)
$C_4F_9SO_3^-$ -continued
(I-39)
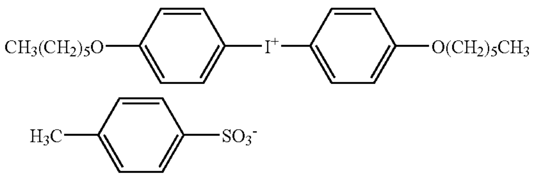
(S-1)
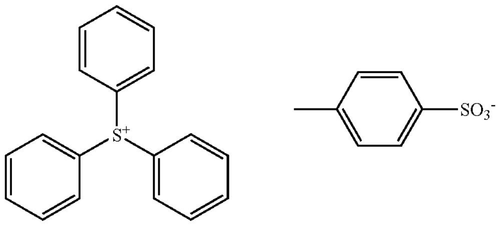
(S-2)
$PF_6^-$
(S-3)
$ClO_4^-$
(S-4)
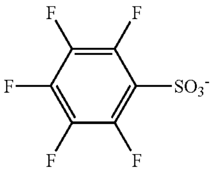
(S-5)
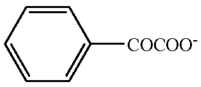
(S-6)
$CF_3SO_3^-$
(S-7)
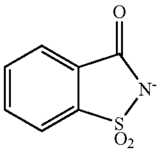
(S-8)
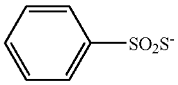
(S-9)
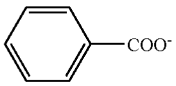
(S-10)
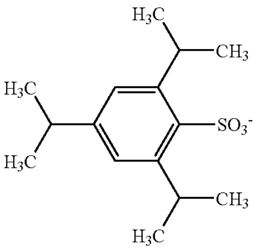
(S-11)
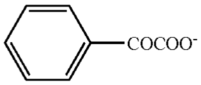
-continued
(S-12)
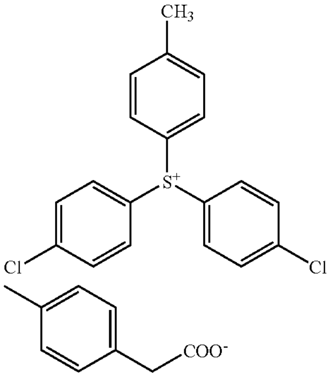
(S-13)
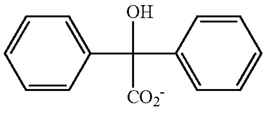
(S-14)
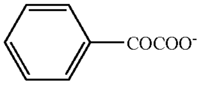
(S-15)
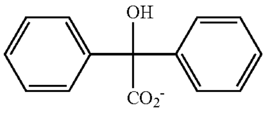
(S-16)
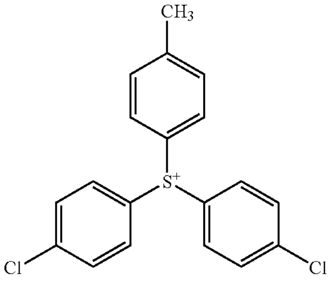
$BF_4^-$
(S-17)
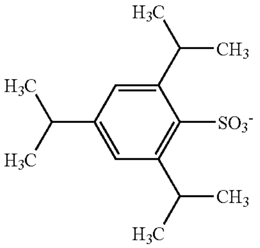
(S-18)
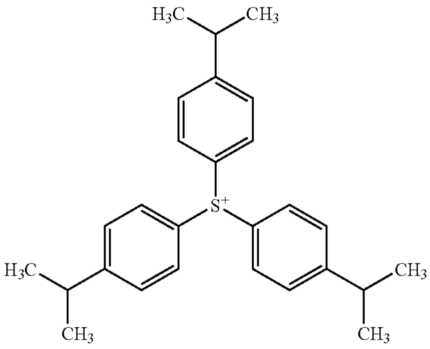

-continued

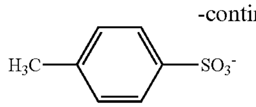

(S-19)

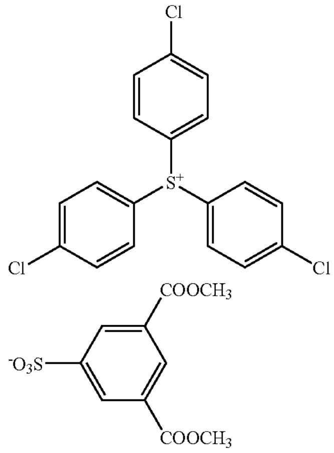

While the polymerization initiator is not limited to those exemplified in the above, the polymerization initiator is more preferably a triazine initiator, an organic halide compound, an oxime ester compound, a diazonium salt, an iodonium salt and a sulfonium salt in view of reactivity and stability. Among these polymerization initiators, an onium salt having an inorganic anion such as $PF_6^-$ or $BF_4^-$ as a counterion is preferable from the viewpoint of improving visibility in combination with the infrared absorbing agent. In addition, the onium salt is preferably diaryliodonium in view of being excellent in coloring property.

The amount of these polymerization initiators contained in the image recording layer is preferably 0.1 to 50% by mass, more preferably 0.5 to 30% by mass and particularly preferably 0.8 to 20% by mass with respect to the total solid content composing the image recording layer. This range allows favorable sensitivity and favorable resistance to dirt of a non-image portion during printing.

The polymerization initiator may be used singly or in combination of two kinds or more thereof. Also, the polymerization initiator may be added to the same layer as other components, or to a layer provided separately from layers of other components.

(C) Polymerizable Compound

The polymerizable compound (C) which can be used in the image recording layer of the planographic printing plate precursor of the invention is an additional polymerizable-compound having at least one ethylenically-unsaturated bond and may be selected from those having at least one, preferably two or more, terminal ethylenic unsaturated bond(s). Such compounds are widely known to those skilled in the art, and any one of them may be used in the invention without particular restriction. These compounds may be in a chemical form such as a monomer, a prepolymer (dimer, trimer or oligomer), or a mixture or copolymer thereof.

Examples of the monomers and the copolymers thereof include unsaturated carboxylic acids (such as acrylic acid, methacrylic acid, itaconic acid, crotonic acid, isocrotonic acid, or maleic acid) and esters and amides thereof; and preferable examples thereof include esters of an unsaturated carboxylic acid and an aliphatic polyhydric alcohol compound, and amides of an unsaturated carboxylic acid and an aliphatic polyvalent amine compound. In addition, addition reaction products of an unsaturated carboxylic ester or amide having a nucleophilic substituent such as hydroxyl, amino, or mercapto group with a monofunctional or multifunctional isocyanate or epoxy compound, and dehydration condensation products thereof with a monofunctional or polyfunctional carboxylic acid, and the like are also preferable. Addition reaction products of an unsaturated carboxylic ester or amide having an electrophilic substituent such as an isocyanate or an epoxy group with a monofunctional or polyfunctional alcohol, amine, or thiol, and substitution reaction products of an unsaturated carboxylic ester or amide having a leaving group such as a halogen or tosyloxy group with a monofunctional or polyfunctional alcohol, amine, or thiol are also preferable. Other examples include compounds in which the unsaturated carboxylic acid is replaced with an unsaturated phosphonic acid, styrene, vinyl ether, or the like.

Specific examples of the esters (as a monomer) of an aliphatic polyhydric alcohol compound and an unsaturated carboxylic acid include:

acrylic esters such as ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, or isocyanuric acid EO-modified triacrylates;

methacrylic esters such as tetramethylene glycol dimethacrylate, triethylene glycol dimethacrylate, neopentylglycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, or bis-[p-(methacryloxyethoxy)phenyl]dimethylmethane;

itaconate esters such as ethylene glycol diitaconate, propylene glycol diitaconate, 1,3-butanediol diitaconate, 1,4-butanediol diitaconate, tetramethylene glycol diitaconate, pentaerythritol diitaconate, or sorbitol tetraitaconate;

crotonate esters such as ethylene glycol dicrotonate, tetramethylene glycol dicrotonate, pentaerythritol dicrotonate, or sorbitol tetradicrotonate;

isocrotonate esters such as ethylene glycol diisocrotonate, pentaerythritol diisocrotonate, or sorbitol tetraisocrotonate;

maleate esters such as ethylene glycol dimaleate, triethylene glycol dimaleate, pentaerythritol dimaleate, or sorbitol tetramaleate; and other esters such as the aliphatic alcohol esters described in JP-B No. 51-47334 and JP-A No. 57-196231, the esters having an aromatic skeleton described in JP-A Nos. 59-5240, 59-5241, and 2-226149, and the amino group-containing esters described in JP-A No. 1-165613.

In addition, a mixture of two or more of the ester monomers described above can be used in the invention.

Specific examples of the amide monomers of an aliphatic polyvalent amine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethaerylamide. Other preferable examples of the amide monomers include amides having a cyclohexylene structure described in JP-B No. 54-21726.

Addition polymerizable-urethane compounds obtained by addition reaction of an iso cyanate and a hydroxyl group are also preferable. Specific examples thereof include vinyl urethane compounds having two or more polymerizable vinyl groups in a molecule thereof, such as those described in JP-B No. 48-41708, which are prepared by adding a vinyl monomer having a hydroxyl group represented by the following Formula (A) to a polyisocyanate compound having two or more isocyanate group in a molecule.

$$CH_2{=}C(R^{4'})COOCH_2CH(R^{5'})OH \qquad (A)$$

(In Formula(A), $R^{4'}$ and $R^{5'}$ each independently represent H or $CH_3$.)

Also preferable are urethane acrylates described in JP-A No. 51-37193 and JP-B Nos. 2-32293 and 2-16765; and urethane compounds having an ethylene oxide skeleton described in JP-B Nos. 58-49860, 56-17654, 62-39417, and 62-39418. It is also possible to obtain a photopolymerizable composition significantly superior in photoresponsive speed by using the addition polymerizable compound having an amino or sulfide structure in the molecule described in JP-A Nos. 63-277653, 63-260909, or 1-105238.

Other preferable examples thereof include polyfunctional acrylates and methacrylates such as polyester acrylates, and epoxyacrylates obtained in reaction of an epoxy resin with acrylic or methacrylic acid, such as those described in JP-A No. 48-64183, and JP-B Nos. 49-43191 and 52-30490. Yet other examples thereof include specific unsaturated compounds described in JP-B Nos. 46-43946, 1-40337, and 1-40336, and vinylphosphonic acid compounds described in JP-A No. 2-25493. In addition, the structures containing a perfluoroalkyl group described in JP-A No. 61-22048 are used favorably in some cases. Further, photosetting monomers and oligomers described in Journal of Adhesion Soc. Jpn. Vol. 20, No. 7, p. 300 to 308 (1984) are also usable.

In the invention, a polymerizable compound having a specific isocyanuric acid structure, which is described in JP-A No. 2005-329708, can be particularly preferably used since the compound (the specific development promoting agent) represented by Formula (I) is used as the (D) component.

The compound represented by the following Formula (II) is preferably used as the polymerizable compound having an isocyanuric acid structure.

Formula (II)

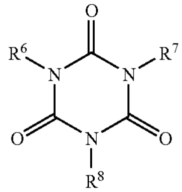

In Formula (II), $R^6$ to $R^8$ each independently represents a hydrogen atom, a polymerizable group or —$R^9$—OH group, and at least one of $R^6$ to $R^8$ is a polymerizable group. The polymerizable group is a group selected from the group consisting of a (meth)acryloyl group, a (meth)acryloyloxyalkyl group and an allyl group, and an alkyl group in the (meth) acryloyloxyalkyl group preferably has 1 to 5 carbon atoms.

The $R^9$ represents an alkylene group, and preferably represents an alkylene group having 1 to 6 carbon atoms.

In the present specification, acryloyl and methacryloyl are generically named (meth)acryloyl.

The polymerizable compound having an isocyanuric acid structure is more preferably a compound having two or more of polymerizable groups selected from a (meth)acryloyl group and a (meth)acryloyloxyethyl group, and is particularly preferably a compound having three thereof from the viewpoint of printing durability.

Specific examples of the polymerizable compound having an isocyanuric acid structure (the compound represented by Formula (II)) include tris[(meth)acryloyloxymethyl]isocyanurate, tris[(meth)acryloyloxyethyl]isocyanurate, tris[(meth) acryloyloxypropyl]isocyanurate, triallyl isocyanurate, bis [(meth)acryloyloxyethyl]hydroxyethylisocyanurate, bis [(meth)acryloyloxymethyl]isocyanurate, allyl hydroxylethyl isocyanurate and (meth)acryloyloxyethylisocyanurate, while the invention is not limited thereto.

Among these, tris[(meth)acryloyloxyethyl]isocyanurate is more preferable, and tris[methaciyloyloxyethyl]isocyanurate is most preferable in view of providing an excellent balance between hydrophilic property concerned in on-press developability and polymerizing ability concerned in printing durability.

The polymerizable compound having an isocyanuric acid structure may be used singly, in combination of two kinds or more thereof, or in combination with other polymerizable compounds.

Details of the use of the addition polymerizable compound such as: what structure is used; whether they are used singly or in combination; the addition amount; or the like can be arbitrarily determined in accordance with the performance and design of the final planographic printing plate precursor. For example, they are selected from the following viewpoints.

In respect of photosensitivity, the structure of the addition polymerizable compound preferably has a high unsaturated group content per one molecule, and in many cases, they are preferably bifunctional or higher-functional. To increase the strength of an image portion (i.e. the cured layer), they are preferably trifunctional or higher-functional. It is also effective to use a method of regulating both photosensitivity and strength by combined use of addition polymerizable compounds having different functionalities and different polymerizable groups (e.g. acrylic esters, methacrylic esters, styrene-containing compounds, and vinyl ether-containing compounds).

The selection and utilization of the addition polymerizable compound are important factors for compatibility and dispersibility thereof with other components (e.g. a binder polymer, an initiator, a colorant etc.) in the recording layer, and the compatibility may be improved by using a low-purity compound, a combination of two or more addition polymerizable compounds and the like. In some cases, a specific structure can be selected in order to improve the adhesiveness to the support or the protective layer described in the following.

The content of the (C) polymerizable compound in the image recording layer is preferably from 5 to 80 wt %, and is more preferably from 25 to 75 wt %, with respect to the total amount of nonvolatile components in the image recording layer.

An appropriate structure, an appropriate formulation, and an appropriate addition amount of the addition polymerizable compound may be arbitrarily selected in consideration of the degree of polymerization inhibition by oxygen, resolution, fogging, change in the refractive index, and surface adhesiveness. In some cases, a coating method such as undercoating or overcoating and a layer structure formed thereby may be adopted.

Microcapsule and Microgel

The image recording layer preferably further contains a microcapsule and/or a microgel in view of obtaining good on-press developability.

Examples of the microcapsule which can be used in the invention include those having all or some of the components of the image recording layer (including the components of (A) to (D)) encapsulated therein, similarly to those described in JP-A Nos. 2001-277740 and 2001-277742. Components may be contained outside the microcapsules in the microcapsule-containing image recording layer. In a preferable embodiment of the microcapsule-containing image recording layer, hydrophobic components are encapsulated, while hydrophilic components are contained outside the microcapsules.

In yet another embodiment, the image recording layer may contain crosslinked resin particles, i.e., microgel. The microgel may contain some of the components of the image recording layer (including the components of (A) to (D)) in the interior of and/or on the surface of the resin particles. In particular, from the viewpoints of image forming sensitivity and printing durability, it is preferable that the microgel is made to be a reactive microgel by being provided with the (C) polymerizable compound on its surface.

A known method may be used for encapsulating the image recording layer components in microcapsules or forming a microgel containing the image recording layer components.

Examples of the method for producing the microcapsules include, but are not limited to, the methods of using coacervation described in U.S. Pat. Nos. 2,800,457 and 2,800,458; the interfacial polymerization methods described in U.S. Pat. No. 3,287,154, JP-B Nos. 38-19574, 42-446, and others; the polymer precipitation methods described in U.S. Pat. Nos. 3,418,250 and 3,660,304; the method using an isocyanate polyol wall-forming material described in U.S. Pat. No. 3,796,669; the method of using an isocyanate wall-forming material described in U.S. Pat. No. 3,914,511; the methods of using a urea-formaldehyde or urea-formaldehyde-resorcinol wall-forming material described in U.S. Pat. Nos. 4,001,140, 4,087,376, and 4,089,802; the method of using a wall-forming material such as a melamine-formaldehyde resin or hydroxypropylcellulose described in U.S. Pat. No. 4,025,455; the in-situ methods involving monomer polymerization described in JP-B No. 36-9163 and JP-A No. 51-9079; the spray drying methods described in U.S. Pat. No. 3,111,407 and British Patent No. 930422; the electrolytic dispersion cooling methods described in British Patent Nos. 952807 and 965074.

A microcapsular wall which can be preferably used in the invention has three-dimensional crosslinks and sells in a solvent. In consideration of these, the microcapsular wall material is preferably polyurea, polyurethane, polyester, polycarbonate, polyamide, or a mixture thereof, and is particularly preferably polyurea or polyurethane. The microcapsular wall may also contain a compound having a crosslinking functional group such as an ethylenic unsaturated bond introducible to a binder polymer.

Examples of the method for preparing the microgel include, but are not limited to, the methods involving particle formation by interfacial polymerization described in JP-B Nos. 38-19574 and 42-446, and the method involving particle formation by nonaqueous dispersion polymerization described in JP-A No. 5-61214.

Any one of known microcapsular production methods such as those described above may be used in the method involving interfacial polymerization.

In a preferable embodiment, the microgel is prepared through particle formation by interfacial polymerization and has a three-dimensional crosslinks. From such a viewpoint, the raw material to be used for forming the microgel is preferably polyurea, polyurethane, polyester, polycarbonate, polyamide, or a mixture thereof, and is more preferably polyurea or polyurethane.

The average diameter of the microcapsule or microgel particle is preferably from 0.01 to 3.0 μm, more preferably from 0.05 to 2.0 μm, and particularly preferably from 0.10 to 1.0 μm. Favorable resolution and storage stability can be obtained in the range above.

Other Components

In addition to the components described above, the image recording layer of the planographic printing plate precursor according to the invention may further contain various compounds in accordance with necessity. Hereinafter, such other additives will be described.

(1) Binder Polymer

The image recording layer of the planograhic printing plate precursor may further contain a binder polymer for improving film strength thereof.

Any one of known binder polymers may be used as the binder polymer without particular restriction. The binder is preferably a polymer having a film forming property. Examples of the binder polymer include acrylic resins, polyvinylacetal resins, polyurethane resins, polyurea resins, polyimide resins, polyamide resins, epoxy resins, methacrylic resins, polystyrene resins, novolak phenol resins, polyester resins, synthetic rubbers, and natural rubbers.

The binder polymer preferably has crosslinking property in view of improvement in the film strength of the image portion. The crosslinking property can be imparted to the binder polymer by introducing a crosslinking functional group, such as an ethylenic unsaturated bond, into the main chain or a side chain of the binder polymer. The crosslinking functional group may be introduced into the binder polymer by copolymerization.

Examples of polymers having ethylenic unsaturated bonds in the main chain of the molecule include poly-1,4-butadiene and poly-1,4-isoprene.

Examples of polymers having ethylenic unsaturated bonds on side chains of the molecule include polymers of an ester of acrylic acid or methacrylic acid or polymers of amide, in which an ester residue or an amide residue therein (R in —COOR or —CONHR) has an ethylenic unsaturated bond.

Examples of the residue (R) having an ethylenic unsaturated bond include $-(CH_2)_n CR^1=CR^2R^3$, $-(CH_2O)_nCH_2CR^1=CR^2R^3$, $-(CH_2CH_2O)_n CH_2CR^1=CR^2R^3$, $-(CH_2)_nNH-CO-O-CH_2CR^1=CR^2R^3$, $-(CH_2)_n-O-CO-CR^1=CR^2R^3$ and $-(CH_2CH_2O)_2-X$ (wherein, $R^1$ to $R^3$ each independently represent a hydrogen atom, a halogen atom, an alkyl group having 1 to 20 carbon atoms, an aryl group having 1 to 20 carbon atoms, an alkoxy group having 1 to 20 carbon atoms, or an aryloxy group having 1 to 20 carbon atoms; $R^1$ and $R^2$ or $R^1$ and $R^3$ may be bonded to each other to form a ring; n represents an integer from 1 to 10; and X represents a dicyclopentadienyl residue).

Specific examples of the ester residue include $-CH_2CH=CH_2$ (described in JP-B No. 7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $—CH_2CH_2—NHCOO—CH_2CH═CH_2$ and $—CH_2CH_2O—X$ (wherein, X represents a dicyclopentadienyl residue).

Specific examples of the amide residue include $—CH_2CH═CH_2$, $—CH_2CH_2—Y$ (wherein, Y represents a cyclohexene residue), and $—CH_2CH_2—OCO—CH═CH_2$.

The crosslinking binder polymer cures when the polymer molecules are crosslinked, for example, by addition of free radicals (polymerization initiating radicals or propagating radicals occurring during the polymerization of the polymerizable compound) to its crosslinking functional groups, which directly causes the addition polymerization of polymer molecules or indirectly causes the addition polymerization via a polymerization chain of the polymerizable compounds. As an alternative, the binder polymer can be cured by formation of crosslinks between polymer molecules caused by generation of polymer radicals through abstraction of an atom in the polymer (for example, a hydrogen atom on the carbon atom adjacent to a functional crosslinking group) by a free radical and mutual binding of the generated polymer radicals.

The content of the crosslinking group in the binder polymer (content of radically polymerizable unsaturated double bond, as determined by iodine titration) is preferably from 0.1 to 10.0 mmol, more preferably from 1.0 to 7.0 mmol, particularly preferably from 2.0 to 5.5 mmol, per 1 g of the binder polymer. Favorable sensitivity and satisfactory storage stability can be obtained in the range above.

The binder polymer preferably has higher solubility or dispersibility in ink and/or damping water in view of improvement in on-press developability of an unexposed portion of the image forming layer.

The binder polymer is preferably lipophilic from the viewpoint of improving the solubility or dispersibility in ink. On the other hand, the binder polymer is preferably hydrophilic from the viewpoint of improving the solubility or dispersibility in damping water. Therefore, in the invention, it is effective to use a combination of a lipophilic binder polymer and a hydrophilic binder polymer.

Examples of hydrophilic binder polymers include polymers having hydrophilic groups such as a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, or a phosphoric acid group.

Specific examples thereof include gum arabic, casein, gelatin, starch compounds, carboxymethylcellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinylalcohols, hydrolyzed polyvinyl acetates having a hydrolysis degree of 60 mol % or more, preferably 80 mol % or more, polyvinylformal, polyvinylbutyral, polyvinylpyrrolidone, homopolymers and copolymers of acrylamide, homopolymers and copolymers of methacrylamide, homopolymers and copolymers of N-methylol acrylamide, polyvinylpyrrolidone, alcohol-soluble nylons, and polyethers of 2,2-bis-(4-hydroxyphenyl)-propane and epichlorohydrin.

The weight-average molecular weight of the binder polymer is preferably 5,000 or more, and is more preferably, 10,000 to 300,000, and the number-average molecular weight of the binder polymer is preferably 1,000 or more, and is more preferably 2,000 to 250,000. The polydispersity (weight-average molecular weight/number-average molecular weight) is preferably 1.1 to 10.

The binder polymer may be obtained by purchasing commercially-available products or by synthesizing according to conventionally-known methods.

The content of the binder polymer in the image recording laye may be from 5 to 90 wt %, preferably 5 to 80 wt %, and more preferably 10 to 70 wt %, with respect to the total solid content in the image recording layer. A favorable image intensity and image forming property can be obtained when the content of the binder polymer is within the above range.

The ratio of polymerizable compound to binder polymer contained in the image forming layer in terms of mass is preferably from 0.5/1 to 4/1.

(2) Surfactant

The image recording layer in the invention preferably contains a surfactant for the purpose of improving on-press developability.

Examples of the surfactant include a nonionic surfactant, an anionicsurfactant, a cationicsurfactant, an amphotericsurfactant, or a fluorochemical surfactant. The surfactant can be used singly or in a combination of two or more thereof.

The nonionic surfactant used in the invention is not particularly limited, and any one of known nonionic surfactants may be used. Examples thereof include polyoxyethylene alkylethers, polyoxyethylene alkylphenylethers, polyoxyethylene polystyrylphenylethers, polyoxyethylene polyoxypropylene alkylethers, glycerols partially esterified with a fatty acid, sorbitans partially esterified with a fatty acid, pentaerythritols partially esterified with a fatty acid, propylene glycol monofatty acid esters, sucroses partially esterified with a fatty acid, polyoxyethylene sorbitans partially esterified with a fatty acid, polyoxyethylene sorbitols partially esterified with a fatty acid, polyethylene glycol fatty acid esters, polyglycerins partially esterified with a fatty acid, polyoxyethylene-modified castor oils, polyoxyethylene glycerols partially esterified with a fatty acid, fatty acid diethanol amides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactant used in the invention is not particularly limited, and any one of known anionic surfactants may be used. Examples thereof include fatty acid salts, abietic acid salts, hydroxyalkanesulfonic acid salts, alkanesulfonic acid salts, dialkyl sulfoscuccinate salts, straight-chain alkylbenzenesulfonic acid salts, branched-chain alkylbenzenesulfonic acid salts, alkylnaphthalenesulfonic acid salts, alkylphenoxypolyoxyethylene propylsulfonic acid salts, polyoxyethylene alkylsulfophenylether salts, N-methyl-N-oleyltaurine sodium salt, N-alkyl-sulfosuccinic monoamide disodium salts, petroleum sulfonic salt, sulfated beef tallow oil, sulfate ester salts of a fatty acid alkyl ester, alkyl sulfate ester salts, polyoxyethylene alkylether sulfate ester salts, fatty acid monoglyceride sulfate ester salts, polyoxyethylene alkylphenylether sulfate ester salts, polyoxyethylene styrylphenylether sulfate ester salts, alkylphosphoric ester salts, polyoxyethylene alkylether phosphoric ester salts, polyoxyethylene alkylphenylether phosphoric ester salts, partially saponified products of styrene/maleic anhydride copolymers, partially saponified products of olefin/maleic anhydride copolymers, and naphthalenesulfonic salt-formalin condensates.

The cationic surfactant used in the invention is not particularly limited, and any one of known cationic surfactants may be used. Examples thereof include alkylamine salts, quaternary ammonium salts, polyoxyethylene alkylamine salts, and polyethylene polyamine compounds.

The amphoteric surfactant used in the invention is not particularly limited, and any one of known amphoteric surfactants may be used. Examples thereof include carboxybetaines, aminocarboxylates, sulfobetaines, aminosulfate esters, and imidazolines.

In the above list of the surfactants, polyoxyethylene may be read as "polyoxyalkylene" such as polyoxymethylene, polyoxypropylene, or polyoxybutylene, and the surfactants obtained by such reading are also usable in the invention.

Still more preferable surfactants are fluorochemical surfactants having a perfluoroalkyl group in the molecule. Examples of the fluorochemical surfactants include anionic surfactants such as perfluoroalkyl carboxylate salts, perfluoroalkyl sulfonate salts, perfluoroalkyl phosphate esters; amphoteric surfactants such as perfluoroalkylbetaines; cationic surfactants such as perfluoroalkyltrimethylammonium salts; and nonionic surfactants such as perfluoroalkylamine oxides, perfluoroalkylethyleneoxide adducts, oligomers containing a perfluoroalkyl group and a hydrophilic group, oligomers containing a perfluoroalkyl group and a lipophilic group, oligomers containing a perfluoroalkyl group, a hydrophilic group and a lipophilic group, and urethanes containing a perfluoroalkyl group and a lipophilic group. Also preferable are the fluorochemical surfactants described in JP-A Nos. 62-170950, 62-226143 and 60-168144.

In an embodiment, only one surfactant can be used. In another embodiment, a combination of two or more surfactants can be used. The content of surfactant in the image recording layer is preferably from 0.001 to 10 wt %, and is more preferably from 0.01 to 7 wt % with respect to the total solid content in the image recording layer.

(3) Colorant

A dye showing a large absorption in the visible light region may be contained in the image recording layer as an image colorant. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes described in JP-A No. 62-293247. In addition, pigments such as phthalocyanine pigments, azo pigments, carbon black, and titanium oxide can also be used favorably.

It is preferable to add the colorant to the image recording layer since the colorant makes it easier to distinguish image portions and non-image portions after image formation. The addition amount of the colorant to the image recording layer is preferably from 0.01 to 10 wt %, and is more preferably from 0.01 to 5 wt %, with respect to the total solid content in the image recording material.

(4) Printing-out Agent

A compound that changes its color in the presence of an acid or radical may be added to the image recording layer in the invention as a printing-out agent so that a printed-out image is formed.

Preferable examples of the compound effective as the printing-out agent include various colorants such as diphenylmethane compounds, triphenylmethane compounds, thiazine compounds, oxazine compounds, xanthene compounds, anthraquinone compounds, iminoquinone compounds, azo compounds, and azomethine compounds.

Specific examples thereof include dyes such as brilliant green, ethyl violet, methyl green, crystal violet, basic Fuchsine, methyl violet 2B, quinaldine red, rose bengal, metanil yellow, thymol sulfophthalein, xylenol blue, methyl orange, paramethyl red, Congo red, benzopurpurin 4B, α-naphthyl red, Nile blue 2B, Nile blue A, methyl violet, malachite green, Parafuchsine, Victoria Pure Blue BOH [manufactured by Hodogaya Chemical Co., Ltd.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spilon Red BEH Special [manufactured by Hodogawa Chemical Co., Ltd.], m-cresol purple, cresol red, rhodamine B, rhodamine 6G, sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone, or 1-β-naphthyl-4-p-diethylaminophenylimino-5-pyrazolone; and leuco dyes such as p,p',p''-hexamethyltriaminotriphenylmethane (leuco crystal violet), and Pergascript Blue SRB (manufactured by Ciba-Geigy Corp.).

In addition, leuco dyes, raw materials for heat-sensitive paper and pressure-sensitive paper, are also favorable. Specific examples thereof include crystal violet lactone, malachite green lactone, benzoylleucomethylene blue, 2-(N-phenyl-N-methylamino)-6-(N-p-toluoyl-N-ethyl)amino-fluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-quinolidinofluorane, 3-(N,N-diethylamino)-6-methyl-7-chlorofluorane, 3-(N,N-diethylannino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-quinolidinofluorane, 3-pyperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)phthalide.

The amount of the dye that changes its color in the presence of an acid or radical and is added to the image recording layer is preferably from 0.01 to 10 wt % with respect to the solid content in the image recording layer.

(5) Polymerization Inhibitor

A few amount of a heat-polymerization inhibitor is preferably added to the image recording layer of the planographic printing plate precursor of the invention during production or storage of the image recording layer in order to prevent undesirable thermal polymerization of the radical polymerizable compound (C).

Preferable examples of the heat-polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene-bis(4-methyl-6-t-butylphenol), and N-nitroso-N-phenyl hydroxylamine aluminum salt.

The amount of the heat-polymerization inhibitor to be added is preferably about 0.01 wt % to about 5 wt % with respect to the total solid content in the image recording layer.

(6) Higher Fatty Acid Compound and the Like

In view of preventing the polymerization inhibition by oxygen, a higher fatty acid compound such as behenic acid or behenic amide may be added to the image recording layer of the planographic printing plate precursor of the invention so that the higher fatty acid compound localizes on the surface of the image recording layer in the drying after application of the image forming layer. The amount of the higher fatty acid compound to be added to the image forming layer is preferably about 0.1 wt % to about 10 wt % with respect to the total solid content in the image recording layer.

(7) Plasticizer

The image recording layer of the planographic printing plate precursor of the invention may contain a plasticizer for the purpose of improving on-press developability.

Preferable examples of the plasticizer include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butylbenzyl phthalate, diisodecyl phthalate, and diallyl phthalate; glycol esters such as dimethylglycol phthalate, ethylphthalylethyl glycolate, methylphthalylethyl glycolate, butylphthalylbutyl glycolate, and triethylene glycol dicaprylic ester; phosphate esters such as tricresyl phosphate and triphenyl phosphate; aliphatic dibasic acid esters such as diisobutyl adipate, dioctyl adipate, dimethyl sebacate, dibutyl sebacate, dioctyl azelate, and dibutyl maleate; polyglycidyl methacrylate, triethyl citrate, glycerol triacetyl esters and butyl laurate.

The content of plasticizer in the image recording layer is preferably about 30 wt % or less with respect to the total solid content in the image recording layer.

(8) Inorganic Fine Particle

The image recording layer of the planographic printing plate precursor of the invention may contain inorganic fine particles for the purpose of improving the cured film strength and the on-press developability.

Preferable examples of the inorganic fine particles include silica, alumina, magnesium oxide, titanium oxide, magnesium carbonate, calcium alginate, and mixtures thereof. The presence of the particles is effective in reinforcement of the cured film and improvement in interfacial adhesiveness caused by providing roughness to the surface of the image recording layer.

The inorganic fine particles preferably have an average diameter of 5 nm to 10 μm, more preferably 0.5 to 3 μm. Within the range above, the particles can be dispersed in the image recording layer stably, the strength of the image recording layer is ensured, and a highly hydrophilic non-image portion resistant to staining during printing can be formed.

The inorganic fine particles described above, for example colloidal silica dispersions, are easily available commercially.

The content of the inorganic fine particles in the image recording layer is preferably 40 wt % or less, and is more preferably 30 wt % or less, with respect to the total solid content in the image recording layer.

(9) Low-molecular Weight Hydrophilic Compound

The image recording layer of the planographic printing plate precursor of the invention may contain a hydrophilic low-molecular weight compound for the purpose of improving on-press developability.

The hydrophilic low-molecular weight compound may be a water-soluble organic compound, and examples thereof include glycols such as ethylene glycol, diethylene glycol, triethylene glycol, propylene glycol, dipropylene glycol, or tripropylene glycol, and ether or ester compounds thereof; polyhydroxy compounds such as glycerol and pentaerythritol; organic amines such as triethanolamine, diethanolamine or monoethanolamine, and salts thereof; organic sulfonic acids such as alkylsulfonic acid, toluenesulfonic acid or benzenesulfonic acid, and salts thereof; organic sulfamic acids such as alkylsulfamic acid, and salts thereof; organic sulfuric acids such as alkylsulfuric acid, and salts thereof; organic phosphonic acids such as phenylphosphonic acid, and salts thereof; and organic carboxylic acids such as tartaric acid, oxalic acid, citric acid, malic acid, lactic acid, gluconic acid, or amino acids, and salts thereof.

Among these, salts of organic sulfonic acids, salts of organic sulfamic acids, and salts of organic sulfuric acids such as sodium salts or lithium salts thereof are preferably used in the invention.

Specific examples of the salts of the organic sulfonic acids include sodium normal-butylsulfonate, sodium isobutylsulfonate, sodium sec-butylsulfonate, sodium tert-butylsulfonate, sodium normal-pentylsulfonate, sodium 1-ethylpropylsulfonate, sodium normal-hexylsulfonate, sodium 1,2-dimethylpropylsulfonate, sodium 2-ethylbutylsulfonate, sodium cyclohexylsulfonate, sodium normal-heptylsulfonate, sodium normal-octylsulfonate, sodium tert-octylsulfonate, sodium normal-nonylsulfonate, sodium allylsulfonate, sodium 2-methylallylsulfonate, sodium benzenesulfonate, sodium para-toluenesulfonate, sodium para-hydroxybenzenesulfonate, sodium para-styrenesulfonate, sodium dimethyl isophthalate-5-sulfonate, disodium 1,3-benzenedisulfonate, trisodium 1,3,5-benzenetrisulfonate, sodium para-chlorobenzenesulfonate, sodium 3,4-dichlorobenzenesulfonate, sodium 1-naphthylsulfonate, sodium 2-naphthylsulfonate, sodium 4-hydroxynaphthylsulfonate, disodium 1,5-naphthyldisulfonate, disodium 2,6-naphthyldisulfonate, and trisodium 1,3,6-naphthyltrisulfonate, and lithium salts obtained by exchanging sodium in these compounds to lithium.

Specific examples of the salts of the organic sulfamic acids include sodium normal-butylsulfamate, sodium isobutylsulfamate, sodium tert-butylsulfamate, sodium normal-pentylsulfamate, sodium 1-ethylpropylsulfamate, sodium normal-hexylsulfamate, sodium 1,2-dimethylpropylsulfamate, sodium 2-ethylbutylsulfamate, and sodium cyclohexylsulfamate, and lithium salts obtained by exchanging sodium in these compounds to lithium.

These compounds have a small structure of a hydrophobic portion and scarce surface-active function, and are definitely distinguished from the surfactant for which long-chain alkylsulfonate and long-chain alkylbenzenesulfonate are favorably used.

Preferable examples of salts of the organic sulfuric acids include a compound represented by the following Formula (3).

Formula (3)

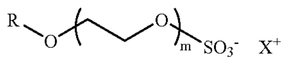

In Formula (3), R represents a substituted or unsubstituted alkyl group, alkenyl group, alkynyl group, aryl group or heterocyclic group, m represents an integer of 1 to 4, and X represents sodium, potassium or lithium.

Preferable examples of R include a substituted or unsubstituted, straight-chain, branched or cyclic alkyl group having 1 to 12 carbon atoms, an alkenyl group having 1 to 12 carbon atoms, an alkynyl group having 1 to 12 carbon atoms and an aryl group having 20 or less carbon atoms. In the case where these groups have a substituent, examples of the substituent include a straight-chain, branched or cyclic alkyl group having 1 to 12 carbon atoms, an alkenyl group having 1 to 12 carbon atoms, an alkynyl group having 1 to 12 carbon atoms, a halogen atom and an aryl group having 20 or less carbon atoms.

Preferable examples of the compound represented by Formula (3) include sodium oxyethylene-2-ethylhexyl ether sulfate, sodium dioxyethylene-2-ethylhexyl ether sulfate, potassium dioxyethylene-2-ethylhexyl ether sulfate, lithium dioxyethylene-2-ethylhexyl ether sulfate, sodium trioxyethylene-2-ethylhexyl ether sulfate, sodium tetraoxyethylene-2-ethylhexyl ether sulfate, sodium dioxyethylenehexyl ether sulfate, sodium dioxyethyleneoctyl ether sulfate and sodium dioxyethylenelauryl ether sulfate. Among them, the most preferable examples of the compound include sodium dioxyethylene-2-ethylhexyl ether sulfate, potassium dioxyethylene-2-ethylhexyl ether sulfate and lithium dioxyethylene-2-ethylhexyl ether sulfate.

The amount of the low-molecular hydrophilic compound added to the image recording layer is preferably 0.5% to 20% by mass, more preferably 1% to 10% by mass, and is particularly preferably 2% to 8% by mass of the total solid content of the image recording layer. This range provides favorable on-press developability and printing durability to the planographic printing plate of the invention.

These compounds may be used singly or by mixing two kinds or more thereof.

(10) Sensitizer

In the case where a inorganic laminar compound is contained in the protective layer described in the following, a phosphonium compound is preferably contained in the image recording layer in order to improve inking property.

This phosphonium compound functions as a surface coating agent (a sensitizer) of the inorganic laminar compound to prevent inking property of the inorganic laminar compound from deteriorating during printing.

Preferable examples of the phosphonium compound include a compound represented by following Formula (4) or Formula (5). The more preferable phosphonium compound is a compound represented by Formula (4).

Formula (4)

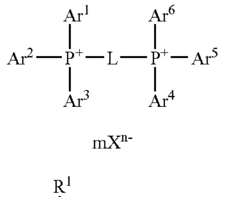

Formula (5)

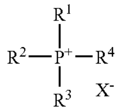

In Formula (4), $Ar^1$ to $Ar^6$ each independently represent an aryl group or a heterocyclic group, L represents a divalent linking group, $X^{n-}$ represents an n-valent counter anion, n represents an integer of 1 to 3, and m represents a number satisfying the equation of n×m=2.

Examples of the aryl group include a phenyl group, a naphthyl group, a tolyl group, a xylil group, a fluorophenyl group, a chlorophenyl group, a bromophenyl group, a methoxyphenyl group, a ethoxyphenyl group, a dimethoxyphenyl group, a methoxycarbonylphenyl group, a dimethylaminophenyl group and the like.

Examples of the heterocyclic group include a pyridyl group, a quinolil group, a pyrimidinyl group, a thienyl group, a furyl group and the like.

L preferably represents a divalent linking group having 6 to 15 carbon atoms, and more preferably represents a divalent linking group having 6 to 12 carbon atoms.

Preferable examples of $X^{n-}$ include a halogen anion such as $Cl^-$, $Br^-$ or $I^-$, a sulfonic acid anion, a carboxylic acid anion, a sulfuric ester anion, $PF_6^-$, $BF_4^-$ and a perchloric anion. Among them, a halogen anion such as $Cl^-$, $Br^-$ or $I^-$, a sulfonic acid anion and a carboxylic acid anion are particularly preferable.

Specific examples of the phosphonium compound represented by Formula (4) are shown below.

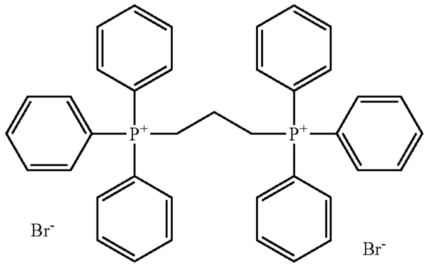

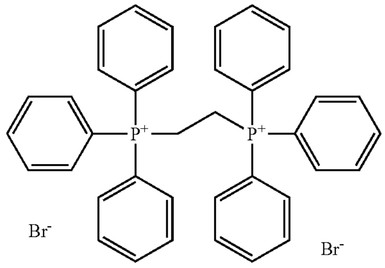

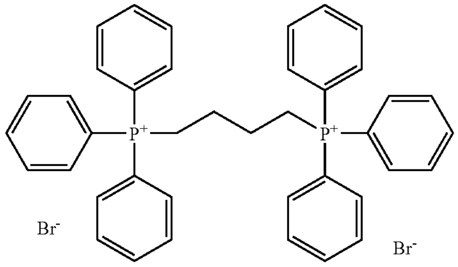

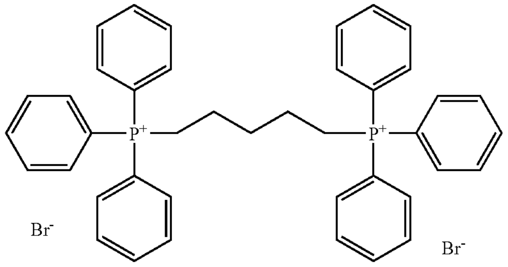

-continued
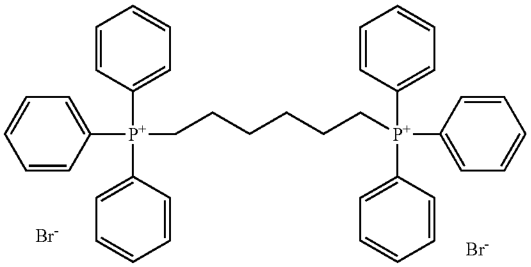
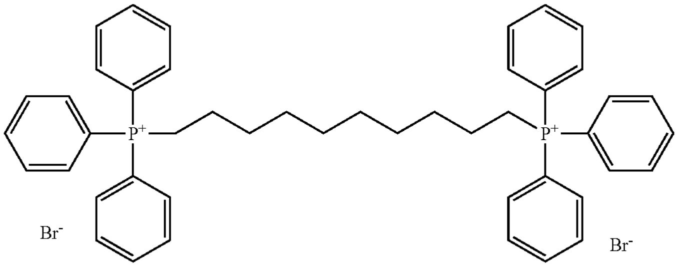
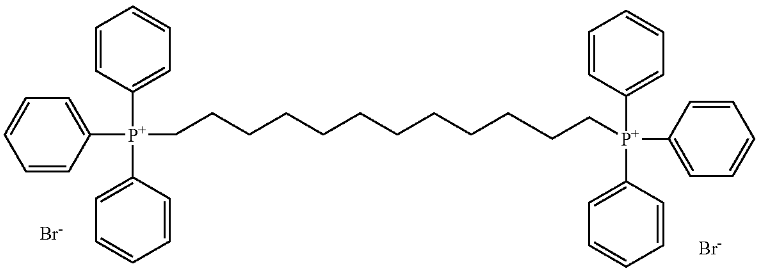
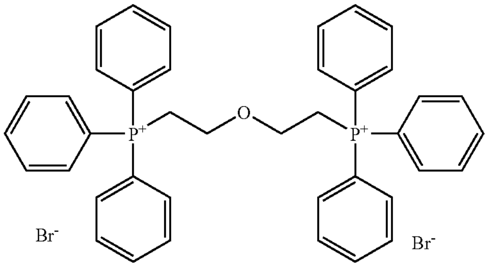
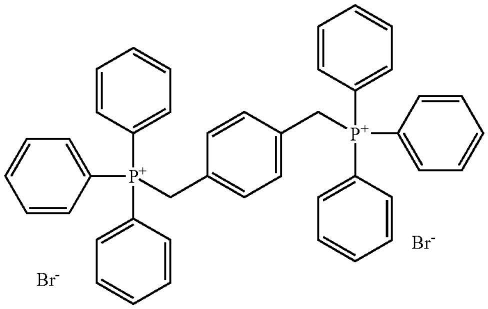
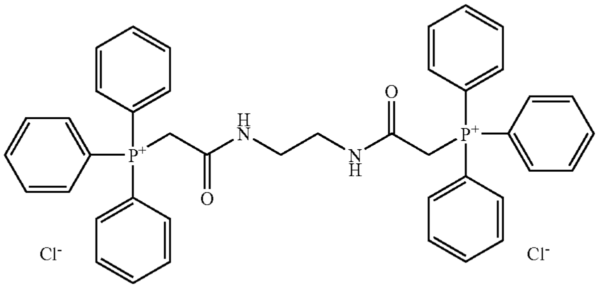
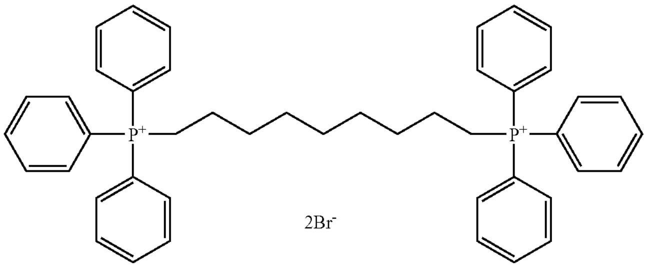

-continued
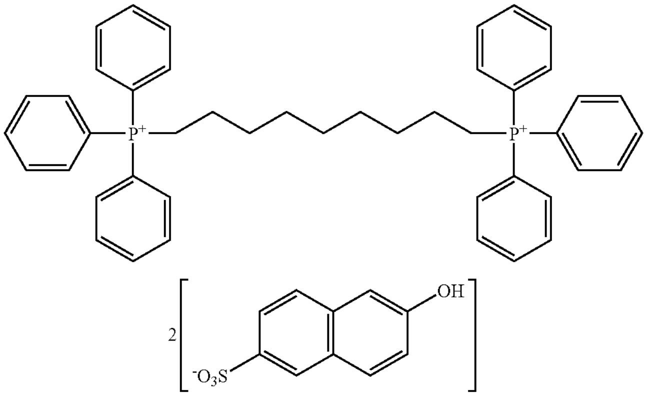
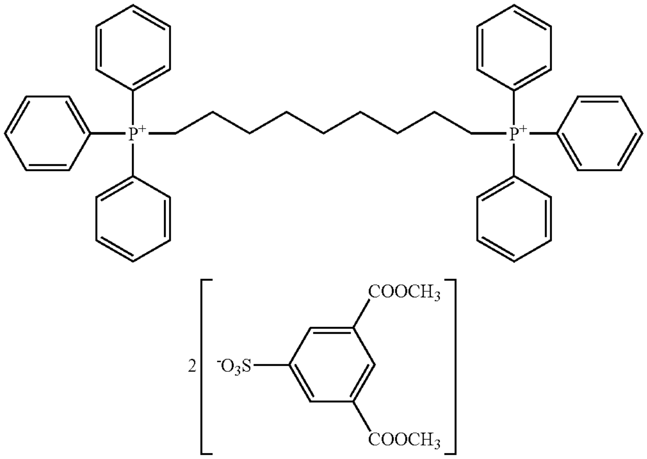
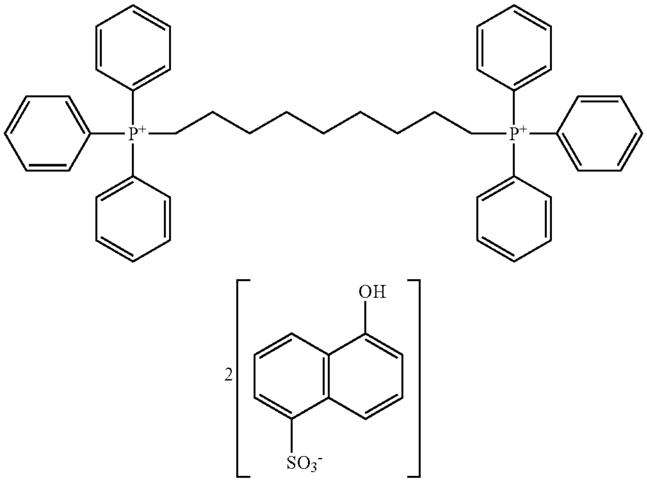

-continued
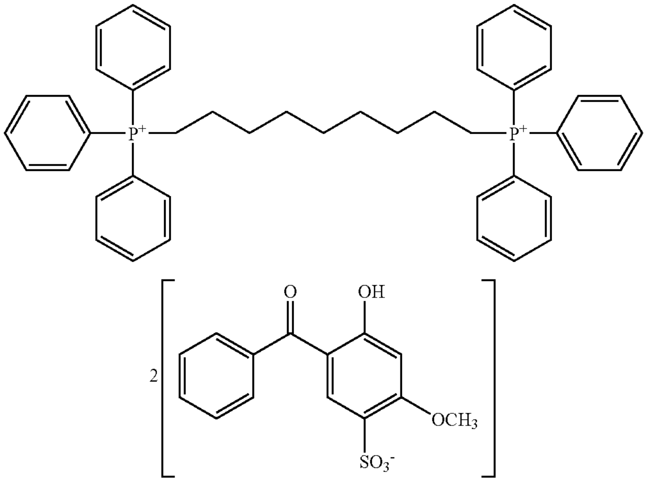
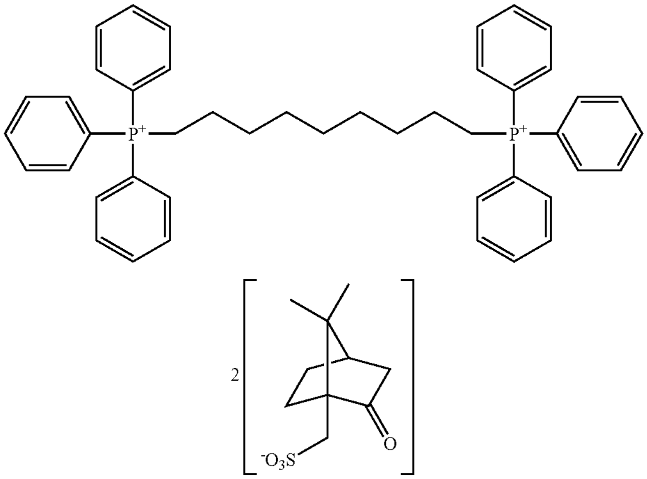
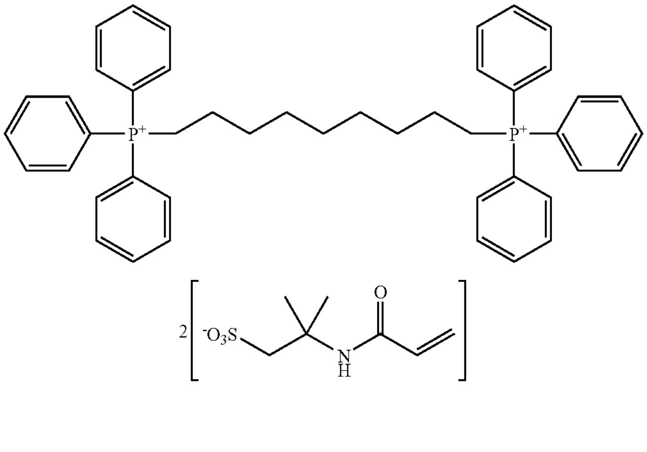

-continued
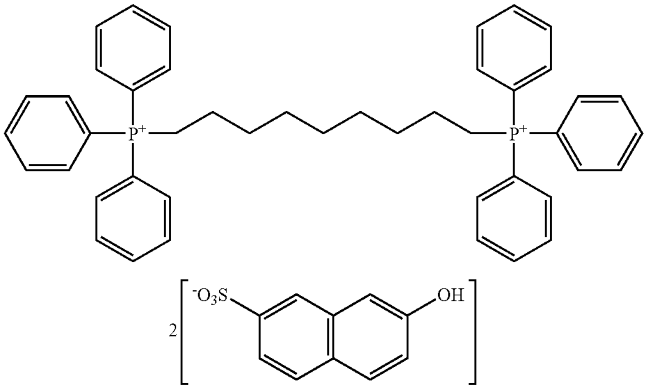
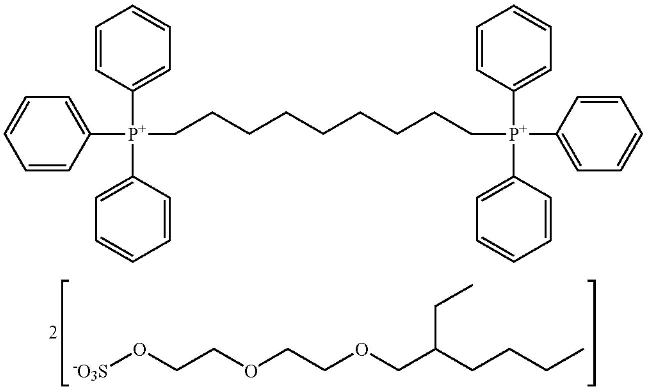
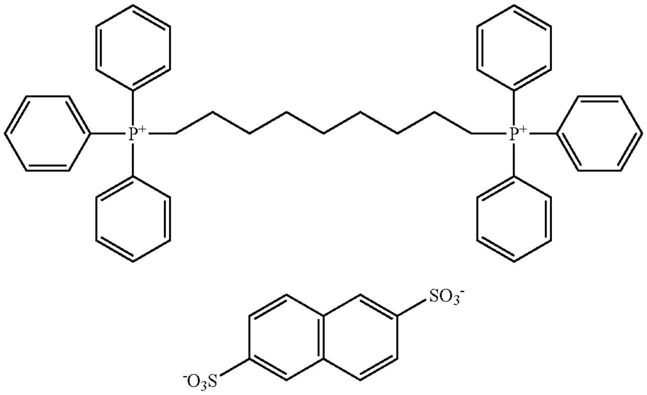
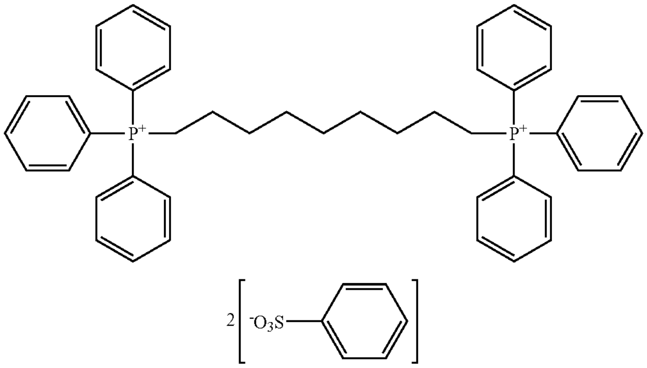

-continued

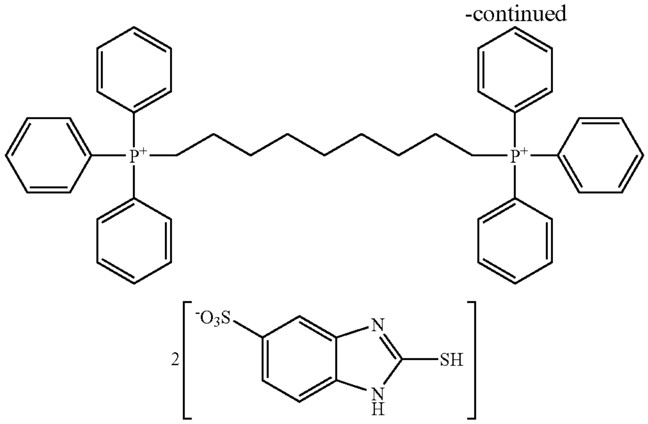

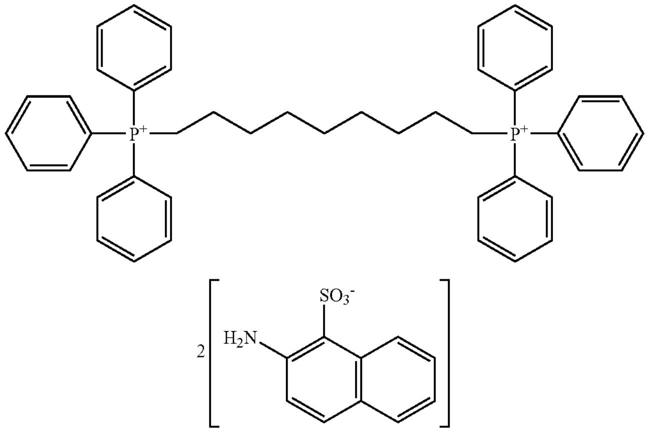

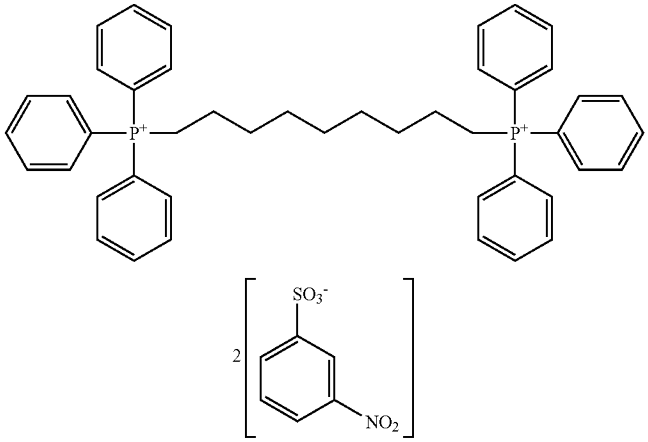

In Formula (5), $R^1$ to $R^4$ each independently represent an alkyl group, an alkenyl group, an alkynyl group, a cycloalkyl group, an alkoxy group, an aryl group, an aryloxy group, an alkylthio group, a heterocyclic group or a hydrogen atom, each of which may have a substituent. Two or more groups among the $R^1$ to $R^4$ may be bonded to form a ring. $X^-$ represents a counter anion.

Here, the number of carbon atoms when the $R^1$ to $R^4$ are an alkyl group, an alkoxy group or an alkylthio group is typically 1 to 20, the number of carbon atoms when the $R^1$ to $R^4$ are an alkenyl group or an alkynyl group is typically 2 to 15, and the number of carbon atoms when the $R^1$ to $R^4$ are a cycloalkyl group is typically 3 to 8.

Examples of the aryl group include a phenyl group and a naphthyl group, examples of the aryloxy group include a phenoxy group and a naphthyloxy group, examples of the arylthio group include a phenylthio group, and examples of the heterocyclic group include a furyl group and a thienyl group.

Examples of a substituent which can be arbitrarily provided to these groups include an alkyl group, an alkenyl group, an alkynyl group, a cycloalkyl group, an alkoxy group, an alkoxycarbonyl group, an acyl group, an alkylthio group, an aryl group, an aryloxy group, an arylthio group, a sulfino group, a sulfo group, a phosphino group, a phosphoryl group, an amino group, a nitro group, a cyano group, a hydroxy group and a halogen atom. These substituents may further have a substituent.

Examples of an anion represented by $X^-$ include a halide ion such as $Cl^-$, $Br^-$ or $I^-$, an inorganic acid anion such as $ClO_4^-$, $PF_6^-$ or $SO_4^{-2}$, an organic carboxylic acid anion and an organic sulfonic acid anion.

Examples of an organic group in the organic carboxylic acid anion and the organic sulfonic acid anion include a methyl group, an ethyl group, a propyl group, a butyl group, a phenyl group, a methoxyphenyl group, a naphthyl group, a fluorophenyl group, a difluorophenyl group, a pentafluorophenyl group, a thienyl group and a pyrrolyl group. Among these, $Cl^-$, $Br^-$, $I^-$, $ClO_4^-$ and $PF_6^-$ are preferable.

Specific examples of the phosphonium compound represented by Formula (5) are shown below.

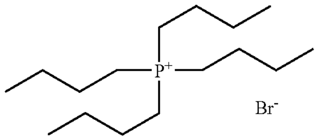

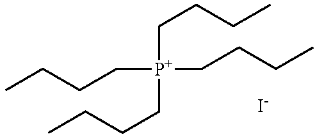

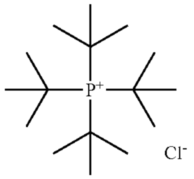

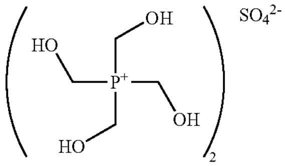

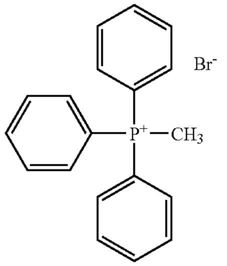

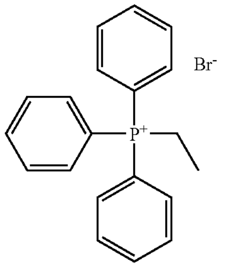

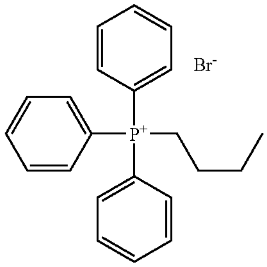

-continued

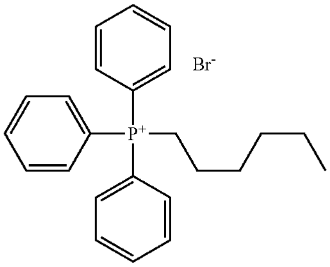

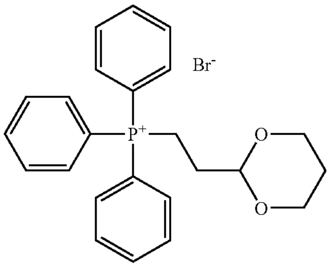

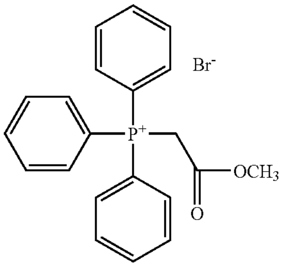

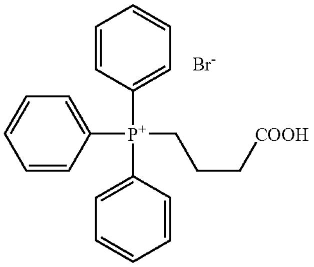

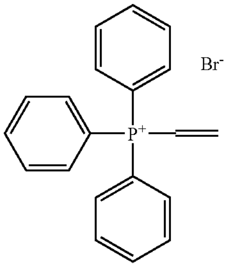

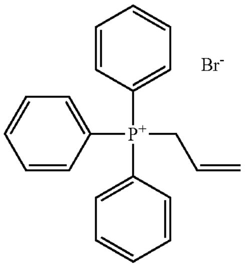

-continued

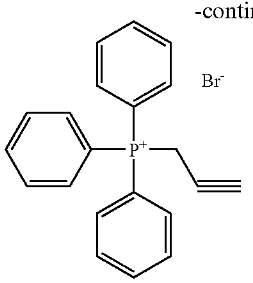

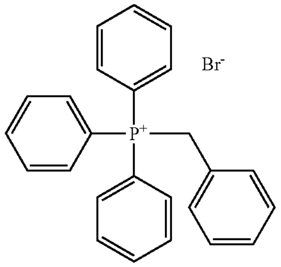

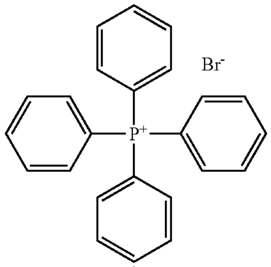

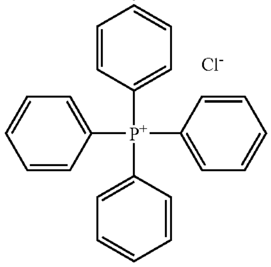

The amount of the phosphonium compound added to the image recording layer is preferably 0.01 to 20% by mass, more preferably 0.05 to 10% by mass, and is particularly preferably 0.1 to 5% by mass of the solid content of the image recording layer. These ranges allow favorable ink inking property during printing.

The sensitizer may be added to not only the image recording layer but also the protective layer described in the following.

(11) Inorganic Laminar Compound

An inorganic laminar compound can be arbitrarily added to the image recording layer in the invention. Details of the inorganic laminar compound are the same as those which can be added to the protective layer described in the following. The addition of the inorganic laminar compound to the image recording layer is useful for improving printing durability, polymerization efficiency (sensitivity) and temporal stability.

The amount of the inorganic laminar compound added to the image recording layer is preferably 0.1 to 50% by mass, more preferably 0.3 to 30% by mass, and is particularly preferably 1 to 10% by mass with respect to the solid content of the image recording layer.

Formation of Image Recording Layer

The image recording layer of the planographic printing plate precursor of the invention may be formed by dispersing or dissolving the necessary components in a solvent to form a coating liquid, applying the coating liquid onto the support and drying the applied coating liquid. Examples of the solvent for use include, but are not limited to, ethylene dichloride, cyclohexanone, methylethylketone, methanol, ethanol, propanol, ethylene glycol monomethylether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butylolactone, toluene, and water. The solvent may be used singly or in a combination of two or more thereof. The solid content of the coating liquid is preferably from 1 to 50 wt % of the total amount of the coating liquid.

The image recording layer of the planographic printing plate precursor of the invention may be formed by providing multiple coating liquids, each of which is prepared by dispersing or dissolving the same or different component in the same or different solvent, and applying the coating liquids by repeating prulal times of coating and drying operation.

The amount (in terms of solid content) of the image recording layer on the support after coating and drying may vary depending on the application, while it is preferably from 0.3 to 3.0 $g/m^2$ in general. Within the range above, favorable sensitivity and favorable film property of the image recording layer can be obtained.

Various methods may be used for coating. Examples thereof include bar coater coating, spin coating, spray coating, curtain coating, dip coating, air knife coating, blade coating, and roll coating.

Protective Layer

A protective layer (overcoat layer) can be preferably provided on the image recording layer of the planographic printing plate precursor according to the invention.

The protective layer a function to impart oxygen-blocking property to prevent an image formation inhibition reaction due to oxygen, as well as a function to prevent scratch or the like on the image recording layer, a function to prevent ablation at the time of high-illumination laser exposure, and the like.

Components and the like regarding the protective layer are explained hereinafter.

The exposure of the planographic printing plate is conducted normally in the air. The image forming reaction in the image recording layer caused by exposure to radiation may be inhibited by low-molecular weight compounds in the air such as oxygen and basic substances. The protective layer prevents entry of the low-molecular weight compounds such as oxygen and basic substances into the image recording layer, and consequently suppresses the reactions that inhibit image formation conducted in the air. Accordingly, desirable characteristics of the protective layer include low permeation to low-molecular weight compounds such as oxygen, superior transmission of the radiation used for exposure, excellent adhesion to the image recording layer, and easy removability during an on-press development step after exposure. Protective layers having such characteristics are described, for example, in U.S. Pat. No. 3,458,311 and JP-B No. 55-49729.

The raw material for the protective layer can be selected appropriately from water-soluble polymers as well as from water-insoluble polymers. Specific examples thereof include water-soluble polymers such as polyvinyl alcohol, modified polyvinyl alcohols, polyvinyl pyrrolidone, polyvinyl imidazole, polyacrylic acid, polyacrylamide, partially saponified product of polyvinyl acetate, ethylene-vinylalcohol copolymers, water-soluble cellulose compounds, gelatin, starch compounds, or gum arabic; and polymers such as polyvinylidene chloride, poly(meta)acrylonitrile, polysulfone, polyvinyl chloride, polyethylene, polycarbonate, polystyrene, polyamide, or cellophane. The raw materials can be used in a combination of two or more thereof as necessary.

Water-soluble polymer compounds which are superior in crystallinity can be relatively useful among the raw materials above. Specific preferable examples thereof include polyvinyl alcohol, polyvinyl pyrrolidone, polyvinyl imidazole, water-soluble acrylic resins such as polyacrylic acid, gelatin, and gum arabic. Among them, polyvinyl alcohol, polyvinyl pyrrolidone, and polyvinyl imidazole are preferable in the point that they can be coated using water as the solvent and they can be easily removed with damping water provided at the time of printing. Among them, polyvinyl alcohol (PVA) gives the most favorable results on basic properties such as oxygen-blocking property or removability at development.

The polyvinyl alcohol for use in the protective layer may be partially substituted by ester, ether, or acetal as long as it still contains unsubstituted vinyl alcohol units substantially in an amount that gives required water solubility. Similarly, the polyvinyl alcohol may contain one or more other copolymerization components in a part. For example, polyvinyl alcohols having various polymerization degrees which randomly have any of various hydrophilic modified units such as an anion-modified unit modified with an anion such as a carboxyl or sulfo group, a cation-modified unit modified with a cation such as an amino or ammonium group, a silanol-modified unit, or a thiol modification unit, and polyvinyl alcohols having various polymerization degrees which have, at a terminal of the polymer chain, any of modified units such as an anion-modified unit, a cation-modified unit, a silanol-modified unit, a thiol modified unit, an alkoxyl modified unit, a sulfide modified unit, an ester modified unit between vinyl alcohol and any of various organic acids, an ester modified unit between the aforementioned anion-modified unit and an alcohol, or an epoxy-modified unit, are preferable.

Preferable examples of the modified polyvinyl alcohol include those having a polymerization degree in the range of 300 to 2,400 and hydrolysed at the degree of 71 to 100 mol % thereof. Specific examples thereof include PVA-105, PVA-110, PVA-117, PVA-117H, PVA-120, PVA-124, PVA124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 manufactured by Kuraray Co. Ltd.

Examples of the modified polyvinyl alcohols include those having an anion-modified unit such as KL-318, KL-118, KM-618, KM-118, or SK-5102; those having a cation-modified unit such as C-318, C-118, or CM-318; those having a terminal thiol-modified unit such as M-205 or M-115; those having a terminal sulfide-modified unit such as MP-103, MP-203, MP-102, or MP-202; those having an ester-modified unit with a higher fatty acid at the terminal such as HL-12E or HL-1203; and those having other reactive silane-modified unit such as R-1130, R-2105 or R-2130.

The protective layer preferably contains an inorganic laminar compound. The laminar compound is a particle having a thin plate shape, and examples thereof include micas including natural micas and synthetic micas such as those represented by the formula of $A(B,C)_{2-5}D_4O_{10}(OH,F,O)_2$ (wherein A represents K, Na, or Ca; B and C each independently represent Fe (II), Fe (III), Mn, Al, Mg, or V; and D represents Si or Al); talcs such as that represented by $3MgO\text{-}4SiO\text{-}H_2O$; teniolite; montmorillonite; saponite; hectolite; and zirconium phosphate.

Examples of the natural micas include white mica, soda mica, phlogopite, black mica, and scaly mica. Examples of the synthetic micas include: non-swelling micas such as fluorine phlogopite $KMg_3(AlSi_3O_{10})F_2$ or K tetrasilicic mica $KMg_{2.5}(Si_4O_{10})F_2$; and swelling micas such as Na tetrasilicic mica $NaMg_{2.5}(Si_4O_{10})F_2$, Na or Liteniolite $(Na,Li)Mg_2Li(Si_4O_{10})F_2$, or montmorillonite-based Na or Li hectolight $(Na,Li)_{1/8}Mg_{2/5}Li_{1/8}(Si_4O_{10})F_2$. Synthetic smectites are also useful.

Among the laminar compounds, fluorine-based swelling micas, which are synthetic laminar compounds, are particularly useful. Swelling clay minerals such as mica, montmorillonite, saponite, hectolite, bentonite or the like have a laminate structure having unit crystal lattice layers with a thickness of approximately 10 to 15 Å, and the degree of intra-lattice metal atom substitutions is significantly higher than other clay minerals. As a result, the lattice layer becomes deficient in the amount of positive charges, and thus cations such as $Li^+$, $Na^+$, $Ca^{2+}$, or $Mg^{2+}$ or an organic cation (e.g., an amine salt, a quaternary ammonium salt, a phosphonium salt or a sulfonium salt) are adsorbed to the interlayer space to compensate the deficiency. These laminar compounds swell in the presence of water. Thus, the compounds are easily cleaved when a shearing force is applied in that state, giving a stable sol in water. Such a tendency is stronger in the case of bentonite and swelling synthetic micas.

With regard to the shape of the laminar compound, the thickness of the laminar compound is preferably as small as possible from the viewpoint of diffusion control, and the plane size of the laminar compound is preferably as large as possible as long as the smoothness of coated surface or the transmission of the activated radiation is not impaired. In consideration of such viewpoints, the aspect ratio of a particle of the laminar compound may be 20 or more, preferably 100 or more, and be particularly preferably 200 or more. The aspect ratio is a ratio of the thickness of the particle to the length of particle, and may be determined, for example, from the projection of the particle in a micrograph. A laminar compound having a greater aspect ratio may create greater effects.

Regarding the particle diameter of the laminar compound, the average diameter may be from 0.3 to 20 μm, preferably from 0.5 to 10 μm, and particularly preferably from 1 to 5 μm. When the particle diameter is less than 0.3 μm, inhibition of penetration of oxygen and moisture may become insufficient, and may not be sufficiently effective. Use of a laminar compound having a diameter of more than 20 μm may cause a problem in that dispersion stability in the coating liquid may become insufficient and coating may not be stable. The average thickness of the particles is preferably 0.1 μm or less, more preferably 0.05 μm or less, and is particularly preferably 0.01 μm or less. For example, a swelling synthetic mica, which is a typical example of the layered inorganic compound, has a thickness of approximately 1 to 50 nm and a plane size of approximately 1 to 20 μm.

Presence of particles of the inorganic laminar compound having a larger aspect ratio in the protective layer leads to improvement in the coated film strength and more effective prevention of permeation of oxygen and moisture; as a result, deterioration of the protective layer by deformation or the like is prevented, and storage stability is improved (e.g., the image forming property of the planographic printing plate precursor is not deteriorated by humidity change even when stored under high-humidity condition for a long time.

An example of a general method for dispersing the laminar compound used in the protective layer will be described. First, 5 to 10 parts by weight of the swelling laminar compound, which is mentioned above as a preferable laminar compound, is added to 100 parts by weight of water, and left sufficiently to reach a stable state so that the laminar compound swells. Then, the mixture is treated with a dispersing machine, so that the laminar compound is dispersed. Examples of the dispersing machine to be used include various mills that mechanically apply direct force for dispersing, high-speed stirring dispersing machines having high shear force, and dispersing machines giving high-intensity ultrasonic energy. Specific examples include a ball mill, a sand grinder mill, a viscomill, a colloid mill, a homogenizer, a dissolver, a Polytron, a homomixer, a homoblender, a Keddy mill, a jet agitator, a capillary emulsifier, a liquid siren, an electromagnetic strain ultrasonic generator, and an emulsifier having a Poleman whistle. A dispersion containing 5 to 10 wt % of the inorganic laminar compound dispersed by the method described above is highly viscous or gelled and extremely excellent in storage stability. When this dispersion is used to prepare a coating liquid for forming a protective layer, the coating liquid is prepared preferably by diluting the dispersion with water and sufficiently stirring it, followed by compounding it with a binder solution.

Regarding the content of the inorganic laminar compound in the protective layer, the ratio of the amount of inorganic laminar compound contained in the protective layer to the amount of the binder used in the protective layer is preferably from 1/100 to 5/1 by weight. When multiple inorganic laminar compounds are used simultaneously, the total content of the inorganic laminar compound is preferably in the aforementioned weight range.

As additional components of the protective layer, glycerol, dipropylene glycol, propionic amide cyclohexanediol, sorbitol or the like may be added to the water-soluble polymer or the water-insoluble polymer in an amount of several wt % with respect to the polymer. Examples of the additional components further include conventional additives such as a (meth)acrylic polymer or a water-soluble plasticizer to improve physical properties of the protective layer as a film.

The protective layer can be formed by using a coating liquid for the protective layer as described in the following. The coating liquid for the protective layer may contain a conventionally-known additive in view of improving adhesiveness of the protective layer to the image recording layer and stability of the coating liquid upon time lapse.

Examples of the additive which can be contained in the coating liquid for the protective layer include an anionic surfactant, an amphoteric surfactant, a nonionic surfactant, a cationic surfactant, and a fluorine surfactant, and specific examples thereof include: anionic surfactants (e.g., sodium alkylsulfate or sodium alkylsulfonate); amphoteric surfactants (e.g., alkylamino carboxylate salts or alkylamino dicarboxylate salt); and nonionic surfactants such as polyoxyethylene alkylphenylether. The amount of the surfactant contained in the coating liquid for the protective layer may be from 0.1 to 100 wt % with respect to the amount of the water-soluble or water-insoluble polymer to be contained in the protective layer.

In addition, in view of the improvement in adhesion of the protective layer to the image portion, for example, JP-A No. 49-70702 and British Patent Application No. 1303578 describe that sufficient adhesisiveness can be obtained when 20 to 60 wt % of an acrylic emulsion, a water-insoluble vinyl pyrrolidone-vinyl acetate copolymer, or the like is mixed with a hydrophilic polymer mainly composed of polyvinyl alcohol and then the mixture is applied on the image recording layer. In the present invention, any one such known techniques may be used.

The protective layer may have additional functions. For example, a colorant (e.g., a water-soluble dye) excellent in transmittance to the infrared rays used for exposure of the recording layer and capable of effectively absorbing light of a wavelength that does not participate in exposure may be added to the protective layer, so that safelight compatibility can thereby be increased without reducing sensitivity.

A protective layer may be formed by coating the liquid for forming the protective layer prepared as described above on the image recording layer provided on a support, followed by drying.

The solvent for the coating liquid may be selected appropriately in consideration of the kind of binder to be used. When a water-soluble polymer is used, distilled water or purified water is preferably used as the solvent.

The method for coating the coating liquid for forming a protective layer is not particularly limited, and any one of known methods such as those described in U.S. Pat. No. 3,458,311 and JP-B No. 55-49729 may be applied. Specifically, the protective layer may be formed by blade coating, air knife coating, gravure coating, roll coating, spray coating, dip coating, bar coating, or the like.

The amount of the protective layer to be applied is preferably in the range of 0.01 to 10 $g/m^2$, more preferably 0.02 to 3 $g/m^2$, and is particularly preferably 0.02 to 1 $g/m^2$, in terms of the amount resulted after drying the coating.

Support

The support used in the planographic printing plate precursor according to the invention is not particularly limited as long as it is a dimensionally stable plate-shaped material. Examples thereof include paper, paper laminated with a plastic material (e.g., polyethylene, polypropylene, or polystyrene), metal plates (e.g., of aluminum, zinc, or copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal), paper or plastic films laminated with a metal selected from the above metals, and paper or plastic films on which a metal selected from the above metals is deposited.

Preferable examples of the support for the planograhpic printing plate precursor include polyester films and aluminum plates. Among them, aluminum plates, which are superior in dimensional stability and relatively inexpensive, are more preferable.

Examples of the aluminum plate include a pure aluminum plate, an alloy plate containing aluminum as the main component and trace amounts of hetero-elements, and a thin film of aluminum or an aluminum alloy laminated with plastic. Examples of the hetero-element contained in the aluminum alloy include silicon, iron, manganese, copper, magnesium, chromium, zinc, bismuth, nickel, and titanium. The content of the hetero-elements in the alloy is preferably 10 wt % or less of the total amount of the alloy. Although pure aluminum plates are preferable in the invention, aluminum plates containing trace amounts of hetero-elements are also usable in consideration of the fact that it is difficult to prepare completely pure aluminum due to the problems in refining process. The composition of the aluminum plate is not particularly limited, and a known material may be used appropriately.

The aluminum plate is preferably subjected to a surface treatment such as a surface roughening treatment or an anodizing treatment before being used. The hydrophilicity of the support and the adhesion between the image recording layer and the support are improved by the surface treatment. Before the surface roughening treatment, the aluminum plate may be, as necessary, subjected to a degreasing treatment with a surfactant, organic solvent, aqueous alkaline solution or the like so as to remove the rolling oil on the surface.

Various methods may be used for surface roughening of the aluminum plate, and examples thereof include a mechanical surface roughening treatment, an electrochemical surface roughening treatment (surface roughening by dissolving the surface electrochemically), and a chemical surface roughening treatment (surface roughening by selectively dissolving the surface chemically).

The method for the mechanical surface roughening may be selected from methods known in the art such as ball polishing, brush polishing, blast polishing, or buff polishing.

The electrochemical surface roughening may be performed, for example, by applying an alternate or direct current to the support in an electrolyte solution containing an acid such as hydrochloric acid or nitric acid. A method of using a mixed acid is also usable, such as the method described in JP-A No. 54-63902.

The aluminum plate after surface roughening treatment may be etched with alkali, using an aqueous solution of potassium hydroxide, sodium hydroxide, or the like if necessary. After being subjected to neutralization, the aluminum plate may be further subjected, as necessary, to an anodizing process so as to improve the abrasion resistance.

The electrolyte to be used for the anodization of the aluminum plate may be selected from various electrolytes that are capable of forming a porous oxide film. In general, the electrolyte may be selected from sulfuric acid, hydrochloric acid, oxalic acid, chromic acid, and mixed acids thereof. The concentration of the electrolyte is determined adequately according to the kind of the electrolyte.

The condition of the anodization may be changed according to the electrolyte to be used, and thus cannot be specified uniquely. In general, the electrolyte concentration may be from 1 to 80 wt %; the liquid temperature may be from 5 to 70° C., the electric current density may be from 5 to 60 A/$dm^2$; the voltage may be from 1 to 100 V; and the electrolysis time may be from 10 seconds to 5 minutes. The amount of the anodic oxide film to be formed is preferably from 1.0 to 5.0 g/$m^2$ and is more preferably from 1.5 to 4.0 g/$m^2$. In this range, it is possible to obtain a planographic printing plate with superior printing durability and scratch resistance of the non-image portion.

The support used in the invention may be a substrate itself having an anodic oxide film, which is surface-treated as described above. Examples of the support further include a substrate which is surface-treated as described above, has the anodic oxide film, and may be further subjected to a treatment properly selected from the group consisting of: enlarging of micropores of the anodic oxide film; sealing of micropores of the anodic oxide film; and surface hydrophilizing by immersing the substrate in an aqueous solution containing a hydrophilic compound, which are described in JP-A Nos. 2001-253181 and 2001-322365, as required in order to further improve adhesive property to the upper layer, hydrophilic property, resistance to dirt and thermal insulating property of the support. Needless to say, these enlarging treatment and sealing treatment are not limited to the treatments described therein, and any conventionally known method may be applied. Examples of the sealing treatment further include a steam sealing as well as a single treatment with fluorozirconic acid, a treatment with sodium fluoride and a steam sealing with an addition of lithium chloride.

The sealing treatment used in the invention is not particularly limited, and conventionally known methods may be used. Among these, a sealing treatment with an aqueous solution containing an inorganic fluorine compound, a sealing treatment with water vapor and a sealing treatment with hot water are preferable. Each of the treatments is described below.

<1> Sealing Treatment with Aqueous Solution Containing Inorganic Fluorine Compound Preferable examples of an inorganic fluorine compound used for the sealing treatment with an aqueous solution containing an inorganic fluorine compound include a metal fluoride.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, ferric fluoride, fluorophosphoric acid and ammonium fluorophosphates. Among these, sodium fluorozirconate, sodium fluorotitanate, fluorozirconic acid and fluorotitanic acid are preferable.

The concentration of an inorganic fluorine compound in the aqueous solution is preferably 0.01% by mass or more, and is more preferably 0.05% by mass or more in view of sufficiently performing the sealing of micropores of the anodic oxide film. Further, the concentration thereof is preferably 1% by mass or less, and is more preferably 0.5% by mass or less in view of resistance to dirt.

It is preferable that the aqueous solution containing the inorganic fluorine compound further contains a phosphate compound. The inclusion of the phosphate compound in the aqueous solution allows improvements in on-press developability and resistance to dirt due to improvement in hydrophilic property of the surface of the anodic oxide film.

Preferable examples of the phosphate compound include a phosphoric acid salts of metals such as alkali metal or alkaline-earth metal.

Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, ammonium sodium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium molybdophosphate, sodium molybdophosphate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferable.

The combination of an inorganic fluorine compound and a phosphate compound is not particularly limited, while it is preferable that aqueous solution contains at least sodium fluorozirconate as the inorganic fluorine compound and at least sodium dihydrogen phosphate as the phosphate compound.

The concentration of the phosphate compound in aqueous solution is preferably 0.01% by mass or more, and is more preferably 0.1% by mass or more in view of improving on-press developability and resistance to dirt and preferably 20% by mass or less, and is more preferably 5% by mass or less in view of solubility.

The ratio of each compound in aqueous solution is not particularly limited, while the mass ratio of an inorganic fluorine compound to a phosphate compound (inorganic fluorine compound/phosphate compound) is preferably 1/200 to 10/1, and is more preferably 1/30 to 2/1.

The upper limit of temperature of the aqueous solution is preferably 20° C. or more, and is more preferably 40° C. or more, while the lower limit of temperature thereof is preferably 100° C. or less, and is more preferably 80° C. or less.

The aqueous solution is preferably pH of 1 or more, and is more preferably pH of 2 or more, while the pH is preferably pH of 11 or less, and is more preferably pH of 5 or less.

A method for the sealing treatment with the aqueous solution containing an inorganic fluorine compound is not particularly limited, and examples thereof include an immersion method and a spray method. Any one of these methods may be conducted once or a plurality of times, and any of these methods may be used in combination of two kinds or more thereof.

Among them, the immersion method is preferable. In the case where the immersion method is performed, the time length for performing the method is preferably 1 second or more, and is more preferably 3 seconds or more, while it is preferably 100 seconds or less, and is more preferably 20 seconds or less.

<2> Sealing Treatment With Water Vapor

Examples of the sealing treatment with water vapor include a method for contacting water vapor which is pressurized or at normal pressure with an anodic oxide film continuously or discontinuously.

The temperature of water vapor is preferably 80° C. or more, and is more preferably 95° C. or more, while it is preferably 105° C. or less.

The pressure of water vapor is preferably in a range of $1.008 \times 10^5$ to $1.043 \times 10^5$ Pa, that corresponds to the range from [(atmospheric pressure)−50 mmAq] to [(atmospheric pressure)+300 mmAq].

The time for contacting water vapor is preferably 1 second or more, and is more preferably 3 seconds or more, while it is preferably 100 seconds or less, and is more preferably 20 seconds or less.

<3> Sealing Treatment With Hot Water

Examples of the sealing treatment with hot water include a method for immersing an aluminum plate with an anodic oxide film formed in hot water.

The hot water may contain inorganic salt (for example, phosphate) or organic salt.

The temperature of hot water is preferably 80° C. or more, and is more preferably 95° C. or more, while it is preferably 100° C. or less.

The time for immersing the aluminum plate in hot water is preferably 1 second or more, and is more preferably 3 seconds or more, while it is preferably 100 seconds or less, and is more preferably 20 seconds or less.

Examples of the method for hydrophilizing the surface of the substrate include an alkali metal silicate method, such as the methods described in U.S. Pat. Nos. 2,714,066, 3,181,461, 3,280,734 and 3,902,734. In the method, the support may be immersed or may be electrolyzed in, for example, an aqueous solution of sodium silicate. Other examples of the hydrophilizing method include a method of treating the support with potassium fluorozirconate described in JP-B No. 36-22063, and the methods of treating the support with polyvinylphosphonic acid described in U.S. Pat. Nos. 3,276,868, 4,153,461 and 4,689,272.

In the case where a support having a surface with insufficient hydrophilic property, such as a polyester film, is used as the support in the invention, it is desirable that the surface is rendered hydrophilic by applying a hydrophilic layer. Preferable examples of the hydrophilic layer include: a hydrophilic layer described in JP-A No. 2001-199175 and is formed by coating a coating solution containing colloid of oxide or hydroxide of at least one element selected from beryllium, magnesium, aluminum, silicon, titanium, boron, germanium, tin, zirconium, iron, vanadium, antimony and transition metal; a hydrophilic layer described in JP-A No. 2002-79772 and has an organic hydrophilic matrix obtained by crosslinking or para-crosslinking an organic hydrophilic polymer; a hydrophilic layer having an inorganic hydrophilic matrix obtained by sol-gel transformation through hydrolysis and condensation reaction of polyalkoxysilane, titanate, zirconate or aluminate; and a hydrophilic layer composed of an inorganic thin film having a surface containing metallic oxide. Among them, the hydrophilic layer formed by coating a coating solution containing colloid of oxide or hydroxide of silicon is preferable.

Also, in the case where a polyester film is used as the support in the invention, an antistatic layer is preferably provided on either or both of a side of the support to which the hydrophilic layer is provided or the opposite side thereof. The configuration in which the antistatic layer is provided between the support and the hydrophilic layer may contribute to an improvement in adhesive property to the hydrophilic layer. Examples of the antistatic layer include a polymer layer in which metallic oxide fine particles and a matting agent are dispersed as described in JP-A No. 2002-79772.

The support preferably has a centerline average roughness of 0.10 to 1.2 μm. In the range above, excellent adhesiveness to the image recording layer, favorable printing durability, and superior staining resistance can be obtained.

The thickness of the support is preferably from 0.1 to 0.6 mm, and is more preferably from 0.15 to 0.4 mm.

Back Coat Layer

A back coat layer may be provided on the back surface of the support as necessary after surface treatment of the support or after formation of an undercoat layer described in the following.

Preferable examples the material for the back coat layer include the organic polymer compounds described in JP-A No. 5-45885 and the coating layers of a metal oxide generated by hydrolysis and polycondensation of an organic or inorganic metal compound described in JP-A No. 6-35174. Among them, alkoxy compounds of silicon such as $Si(OCH_3)_4$, $Si(OC_2H_5)_4$, $Si(OC_3H_7)_4$, or $Si(OC_4H_9)_4$ are preferable in the point of its low cost and easy availability.

Undercoat Layer

An undercoat layer may be provided between the image recording layer and the support in the planographic printing plate precursor according to the invention as necessary. The undercoat layer facilitates separation of unexposed portions of the image recording layer from the support, leading to improved on-press developability. Further, the undercoat layer, which functions as a heat-insulating layer, prohibits the heat generated by exposure to infrared laser radiation from diffusing into the support, and thus allows efficient use of the heat. Therefore, there is an advantage in that the sensitivity can be improved.

Specifically, preferable examples of the compound for forming the undercoat layer include a silane-coupling agent having an addition-polymerizable ethylenic double-bond reactive group such as those described in JP-A No. 10-282679, and a phosphorus compound having an ethylenic double-bond reactive group such as those described in JP-A No. 2-304441.

More preferable examples of the compound for forming the undercoat layer include a polymer resin having a polymer resin having an adsorptive group, a hydrophilic group, and a crosslinking group. The polymer resin is preferably formed by copolymerizing an adsorptive group-containing monomer, a hydrophilic group-containing monomer, and a crosslinking group-containing monomer.

The polymer resin for forming the undercoat layer preferably has a group that can be adsorbed on the hydrophilic support surface. Examples of the method to determine if the polymer resin has a property to adsorb onto the hydrophilic surface of the support include the following method.

A test compound is dissolved in a good solvent to form a coating liquid, and the coating liquid is applied on a support and dried to give a coating amount of 30 mg/m$^2$ after drying. Then, the support coate with the test compound is washed sufficiently with a good solvent, and the amount of the test compound remaining on the support (the test compound that was not washed away) is determined, from which the amount of the test compound adsorbed on the support is calculated. The residual amount may be determined directly from the measurement of the amount of the remaining compound, or alternatively, indirectly from quantitative measurement of the amount of the test compound dissolved in the washing solution. The quantitative determination of the compound may be performed, for example, by fluorescent X-ray analysis, reflection spectroscopic absorbance measurement, liquid chromatography measurement, or the like. Herein, the term “compound that can be adsorbed on the support” refers to a compound that remains in an amount of at least 1 mg/m$^2$ after the washing described above.

The adsorptive group that is adsorptive to the hydrophilic support surface is a functional group that can form a chemical bond (e.g., an ionic bond, a hydrogen bond, a coordination bond, or a bond based on intermolecular force) with a substance (e.g., metal or metal oxide) or a functional group (e.g., a hydroxyl group) present on the hydrophilic support surface. The adsorptive group is preferably an acidic group or a cationic group.

The acidic group preferably has an acid dissociation constant (pKa) of 7 or less. Examples of the acidic group include a phenolic hydroxyl groups a carboxyl group, $—SO_3H$, $—OSO_3H$, $—PO_3H_2$, $—OPO_3H_2$, $—CONHSO_2—$, $—SO_2NHSO_2—$ and $—COCH_2COCH_3$. Among these, $—OPO_3H_2$ and $—PO_3H_2$ are particularly preferable. The acidic group may alternatively be a metal salt.

The cationic group is preferably an onium group. Examples of the onium group include an ammonium group, a phosphonium group, an arsonium group, a stibonium group, an oxonium group, a sulfonium group, a selenonium group, a stannonium group, and a iodonium group. Among these, an ammonium group, a phosphonium group, and a sulfonium groups are preferable; an ammonium group and a phosphonium group are more preferable; and an ammonium group is most preferable.

Particularly preferable examples of the adsorptive group-containing monomer used for synthesizing the polymer resin used for forming the under coat layer include a compound represented by the following Formula (U1) or (U2).

Formula (U1)

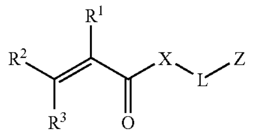

Formula (U2)

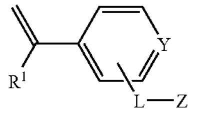

In Formulae (U1) and (U2), $R^1$, $R^2$ and $R^3$ each independently represent a hydrogen atom, a halogen atom, or an alkyl group having 1 to 6 carbon atoms. It is preferable that $R^1$, $R^2$ and $R^3$ each independently represent a hydrogen atom or an alkyl group having 1 to 6 carbon atoms, more preferably a hydrogen atom or an alkyl group having 1 to 3 carbon atoms, and is particularly preferably a hydrogen atom or a methyl group. $R^2$ and $R^3$ are each particularly preferably a hydrogen atom.

Z represents the adsorptive group which is adsorptive to the hydrophilic surface of the support as described above.

In Formulae (U1) and (U2), L represents a single bond or a divalent connecting group.

L is preferably a divalent aliphatic group (such as an alkylene group, a substituted alkylene group, an alkenylene group, a substituted allcenylene group, an alkynylene group, or a substituted alkynylene group), a divalent aromatic group (such as an arylene group or a substituted arylene group), a divalent heterocyclic group, or a combination of one or more of the forementioned divalent connecting groups with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

The divalent aliphatic group may have a cyclic or branched structure. The number of the carbon atoms in the divalent aliphatic group is preferably from 1 to 20, more preferably from 1 to 5, and is particularly preferably from 1 to 10. The divalent aliphatic group is more preferably a saturated aliphatic group rather than being an unsaturated aliphatic group. The divalent aliphatic group may have one or more substituents. Examples of the substituents include a halogen atom, a hydroxyl group, an aromatic group, and a heterocyclic group.

The number of the carbon atoms of the divalent aromatic group is preferably from 6 to 20, more preferably from 6 to 15, and is particularly preferably from 6 to 10. The divalent aromatic group may have one or more substituents. Examples of the substituents include a halogen atom, a hydroxyl group, an aliphatic group, an aromatic group, and a heterocyclic group.

The divalent heterocyclic group preferably has a five- or six-membered heterocyclic ring. The divalent heterocyclic ring may be fused with another heterocyclic ring, an aliphatic ring or an aromatic ring. The heterocyclic group may have one or more substituents. Examples of the substituents include a halogen atom, a hydroxyl group, an oxo group (=O), a thioxo group (=S), an imino group (=NH), a substituted imino group (=N—R, wherein R represents an aliphatic group, an aromatic group or a heterocyclic group), an aliphatic group, an aromatic group and a heterocyclic group.

L is preferably a divalent connecting group containing multiple polyoxyalkylene structures. The polyoxyalkylene structure is more preferably a polyoxyethylene structure. In other words, L preferably contains $-(OCH_2CH_2)_n-$ (n represents an integer from 2 or greater).

In Formula (U1), X represents an oxygen atom (—O—) or an imino group (—NH—). X is preferably an oxygen atom.

In Formula (U2), Y represents a carbon atom or a nitrogen atom. When Y is a nitrogen atom and L binds to Y to form a quaternary pyridinium group, the quaternary pyridinium group is adsorptive itself. In this case, it is not essential for Z to be the absorptive functional group, and Z may be a hydrogen atom.

Hereinafter, specific examples of the monomers represented by Formula (U1) or (U2) will be listed.

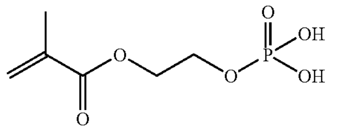

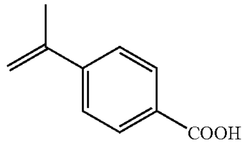

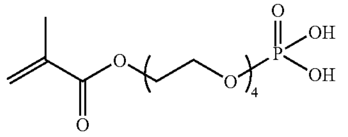

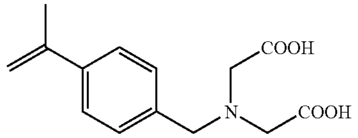

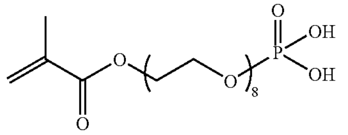

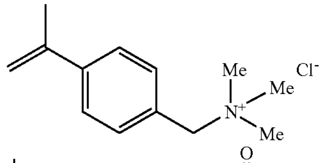

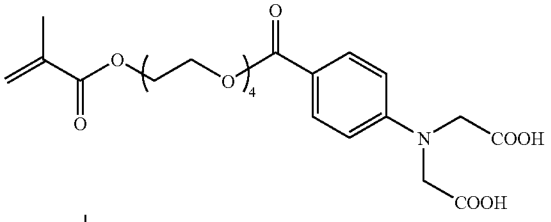

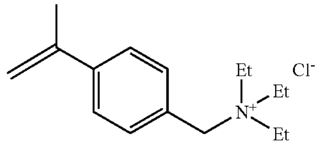

-continued

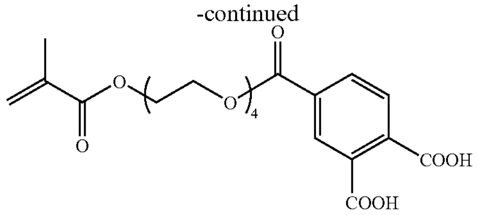

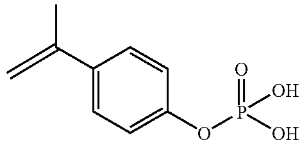

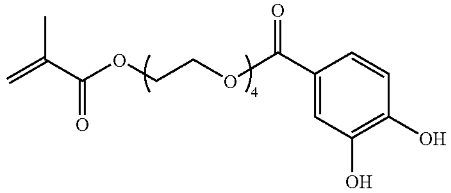

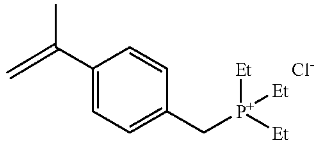

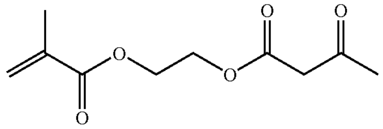

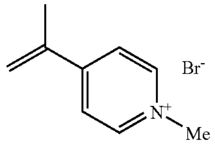

The polymer resin suitable as the compound for forming the undercoat layer preferably has a hydrophilic group. Preferable examples of the hydrophilic group include a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, and a phosphoric acid group. Among these, a sulfonic acid group, which has a high hydrophilicity, is more preferable as the hydrophilic group.

Specific examples of the monomer having a sulfonic acid group include sodium salts and amine salts of methallyloxybenzenesulfonic acid, allyloxybenzenesulfonic acid, altylsulforic acid, vinylsulfonic acid, para-styrenesulfonic acid, methallylsulfonic acid, acrylamide tert-butylsulfonic acid, 2-acrylamide-2-methylpropanesulfonic acid or (3-acryloyloxypropyl)butylsulfonic acid. Among them, sodium 2-acrylamide-2-methylpropanesulfonate is preferable in view of hydrophilic ability and handling of synthesis.

These are appropriately used in synthesizing polymer resin suitable as the compound for forming the under coat layer.

The polymer resin for forming the undercoat layer used in the invention preferably has a crosslinking group. The presence of a crosslinking group improves adhesiveness to the image portion. Examples of the method for imparting crosslinking property to the polymer resin for forming the undercoat layer include: a method of introducing a crosslinking functional group such as ethylenic unsaturated bond into side chains of the polymer; and a method of forming a salt structure between the polymer resin and a compound having an ethylenic unsaturated bond and a substituent with the opposite charge to the charge of the polar substituents on the polymer resin.

Examples of a polymer having an ethylenic unsaturated bond on its side chain include polymers of esters or amides of an acrylic acid or a methacrylic acid wherein an ester residue or an amide residue therein (R of —COOR or —CONHR) contains an ethylenic unsaturated bond.

Examples of the residues (R) having an ethylenic unsaturated bond include $-(CH_2)_nCR^1{=}CR^2R^3$, $-(C_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$, and $-(CH_2CH_2O)_2-X$ (wherein, $R^1$ to $R^3$ each independently represent a hydrogen atom, a halogen atom, an alkyl group, an aryl group, an alkoxy group, or an aryloxy group having 1 to 20 carbon atoms; $R^1$ and $R^2$ and/or $R^1$ and $R^3$ may bond to each other to form a ring; n represents an integer from 1 to 10; and X represents a dicyclopentadienyl residue).

Specific examples of the ester residue include $-CH_2CH{=}CH_2$ (described in JP-B No. 7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2NHCOO-CH_2CH{=}CH_2$, and $-CH_2CH_2O-X$ (wherein, X represents a dicyclopentadienyl residue).

Specific examples of the amide residue include $-CH_2CH{=}CH_2$, $-CH_2CH_2O-Y$ (wherein, Y represents a cylcohexene residue), and $-CH_2CH_2OCO-CH{=}CH_2$.

The crosslinking group-containing monomer for the polymer resin for forming the undercoat layer is preferably an ester or an amide of an acrylic acid or a methacrylic acid having the crosslinking group.

The content of the crosslinking group in the polymer resin for forming the undercoat layer (the content of radical polymerizable unsaturated double bonds as determined by iodine titration) is preferably from 0.1 to 10.0 mmol, more preferably from 1.0 to 7.0 mmol, and is particularly preferably from 2.0 to 5.5 mmol, per 1 g of the polymer resin. In the range above, favorable sensitivity and staining resistance can be obtained at the same time, and satisfactory storage stability can also be achieved.

The weight-average molecular weight of the polymer resin for forming the undercoat layer is preferably 5,000 or more, and is more preferably 10,000 to 300,000. The number-average molecular weight of the polymer resin for forming the undercoat layer is preferably 1,000 or more, and is more preferably from 2,000 to 250,000. The polydispersity (the weight-average molecular weight/the number-average molecular weight) is preferably from 1.1 to 10.

The polymer resin for forming the undercoat layer may be a random polymer, a block polymer, a graft polymer, or the like, and is preferably a random polymer.

Only one polymer resin for forming the undercoat layer may be used as the polymer resin for forming the undercoat layer, or alternatively, a combination of two or more polymer resin may be used in the invention.

A coating liquid for forming the undercoat layer can be formed by dissolving the polymer resin for forming the undercoat layer to an organic solvent such as methanol, ethanol, acetone, methylethylketone or the like and/or water.

The coating liquid for forming the undercoat layer may further contain an Infrared absorbing agent.

Various conventionally-known methods can be performed to apply the coating liquid for forming the undercoat layer onto the support. Examples thereof include bar coater coating, spin coating, spray coating, curtain coating, dip coating, air knife coating, blade coating, and roll coating.

The amount of the undercoat layer coated (solid content) is preferably from 0.1 to 100 $mg/m^2$, and is more preferably from 1 to 30 $mg/m^2$.

Printing Method

The printing method of the invention includes at least: providing the planographic printing plate precursor; imagewise exposing and mounting the planographic printing plate precursor on a printing press, wherein the exposing is performed either before or after the mounting; supplying printing ink and dampening water and performing on-press development of the exposed planographic printing plate precursor to form a planographic printing plate; and printing using the planographic printing plate.

Details of the Printing Method of the Invention are Explained Hereinafter.

A laser is preferable as a light source used for imagewise exposure in the printing method of the invention. The laser used in the invention is not particularly limited, while preferable examples thereof include a solid laser and a semiconductor laser for irradiating infrared rays with a wavelength of 760 to 1,200 nm, and a semiconductor laser for irradiating light with a wavelength of 250 to 420 nm.

It is preferable that the infrared laser has an output of 100 mW or more, the exposure time per picture element therewith is within 20 microseconds, and the amount of irradiation energy provided thereby is 10 to 300 mJ/cm$^2$. It is preferable that the semiconductor laser for irradiating light with a wavelength of 250 to 420 nm has an output of 0.1 mW or more. In either of the lasers, a multi-beam laser device is preferably used for shortening exposure time.

The exposed planographic printing plate precursor is mounted on a printing cylinder of a printing press. In the case where the printing press is a printing press having a laser exposure device, the planographic printing plate precursor can be firstly mounted on a printing cylinder of the printing press and thereafter subjected to image exposure.

When a planographic printing plate precursor is used for printing with supplied dampening water and printing ink after being imagewise exposed to laser radiation without undergoing a development process such as a wet development, an exposed portion in the image recording layer is cured to form a region having a lipophilic surface to receive the printing ink. On the other hand, an unexposed portion in the image recording layer is uncured and is removed by being dissolved or dispersed in the supplied dampening water and/or the printing ink so that a hydrophilic surface is exposed in a region corresponding to the removed unexposed portion. As a result, the dampening water adheres to the thus revealed hydrophilic surface, while the printing ink adheres to the image recording layer in the exposed portion, allowing initiation of printing.

Either the dampening water or the printing ink may be firstly supplied to the printing surface of the thus-formed printing plate, while it is preferable to supply the printing ink first in view of preventing contaminations of the dampening water with the image recording layer in the unexposed portion. Generally-used damping water and printing ink for planographic printing may be used respectively as the amping water and the printing ink.

In this way, the planographic printing plate precursor is developed on an offset printing press, and is used for printing of multiple sheets of paper.

EXAMPLES

Hereinafter, the present invention is described in detail by way of Examples, while the Examples should not be construed as limiting the invention.

Examples 1 to 5 and Comparative Example 1

1. Preparation of Planographic Printing Plate Precursor (1) Preparation of Aluminum Support An aluminum plate containing 99.50 wt % or more of Al; 0.25 wt % of Si; 0.40 wt % of Fe; 0.05 wt % of Cu; 0.05 wt % of Mn; 0.05 wt % of Mg; 0.05 wt % of Zn; and 0.03 wt % of Ti and having a thickness of 0.3 mm was degreased with aqueous 10 wt % sodium aluminate solution for removal of surface rolling oil at 50° C. for 30 seconds, and the aluminum surface was grained with three bundle nylon brushes having a bristle diameter of 0.3 mm by using an aqueous suspension of pumice containing pumice particles with a median diameter of 25 μm (specific density: 1.1 g/cm$^3$), followed by sufficient washing with water. The plate was immersed and etched in an aqueous 25 wt % sodium hydroxide solution at 45° C. for 9 seconds, washed with water, and then, immersed in 20 wt % nitric acid at 60° C. for 20 seconds and washed with water. The amount of etching on the grained surface was approximately 3 g/m$^2$.

The plate was subjected to continuous electrochemical surface roughening treatment with an alternating voltage of 60 Hz. The electrolytic solution used was 1 wt % aqueous nitric acid solution (containing 0.5 wt % of aluminum ion) at a temperature of 50° C. The electrochemical surface roughening treatment was carried out with a carbon electrode as a counter electrode, using a trapezoid rectangular wave alternating current wherein the time TP required for the electric current to change from 0 to the peak value was 0.8 msec and the duty ratio was 1:1. Ferrite was used as an assistant anode. The current density was 30 A/dm$^2$ in terms of the electric current peak value, and 5% of the electric current from the power source was distributed to the assistant anode. During the electrolysis with nitric acid, the quantity of electricity was 175 C/dm$^2$ in terms of quantity of electricity at the time the aluminum plate works as the anode. Thereafter, the plate was washed with sprayed water.

Then, the plate was subjected to electrochemical surface roughening in an electrolyte solution of aqueous 0.5 wt % hydrochloric acid solution (containing aluminum ion at 0.5 wt %) at a liquid temperature of 50° C. under the condition of an electrical quantity of 50 C/dm$^2$ when the aluminum plate works as the anode, by a method similar to the nitric acid electrolysis described above. Then, the plate was washed with sprayed water. A direct current anodic oxide film having a thickness of 2.5 g/m$^2$ was formed on the plate by using an electrolyte solution of 15 wt % sulfuric acid (containing 0.5 wt % of aluminum ion) at an electric current density of 15 A/dm$^2$, washed with water, and dried. Further, the plate was processed in an aqueous 2.5 wt % No. 3 sodium silicate solution at 70° C. for 13 seconds. The centerline average roughness (Ra) of the support, as determined by using a needle having a diameter of 2 μm, was 0.51 μm.

(2) Preparation of Undercoat Layer

The following undercoat liquid (1) for forming an undercoat layer was further applied on the thus obtained support so that a dry coating amount thereof become 18 mg/m$^2$ and the coated liquid was dried so as to form an undercoat layer.

| Formulation of Undercoat solution (1) | |
|---|---|
| Compound (1) for forming undercoat layer (weight-average molecular weight: 60,000) | 0.018 g |
| Methanol | 55.24 g |
| Water | 6.15 g |

Compound (1) for forming undercoat layer

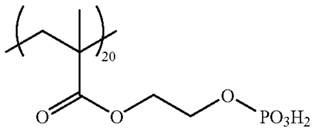

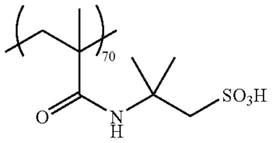

-continued

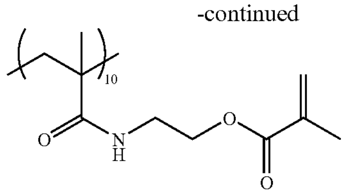

(3) Formation of Image Recording Layer

Any one of the coating liquid 1 to 6 for forming an image recording layer in the following Table 1 was bar-coated on the undercoat layer of the support and was dried in an oven at 120° C. for 40 seconds to form an image recording layer of any one of planographic printing plate precursors of Examples 1 to 5, Comparative example 1 and Reference example 1 having dry coating amount of 1.2 g/m$^2$.

TABLE 1

| | Coating liquid 1 | Coating liquid 2 | Coating liquid 3 | Coating liquid 4 | Coating liquid 5 | Coating liquid 6 |
|---|---|---|---|---|---|---|
| Infrared absorbing agent (1) | 0.33 g | 0.33 g | 0.33 g | 0.33 g | 0.33 g | 0.33 g |
| Polymerization initiator (1) | 1.84 g | 1.84 g | 1.84 g | 1.84 g | 1.84 g | 1.84 g |
| Binder polymer (1) (average molecular weight: 80,000) | 1.92 g | 1.92 g | 1.92 g | 1.92 g | 1.92 g | 1.92 g |
| Tris(acryloyloxyethyl)isocyanurate (manufactured by Shin-Nakamura Chemical Co., Ltd.) | 3.15 g | 2.84 g | 2.22 g | 1.59 g | 0.46 g | 3.46 g |
| Tris(2-hydroxyethyl)isocyanurate (manufactured by Tokyo Chemical Industry Co., Ltd.) | 0.31 g | 0.62 g | 1.24 g | 1.86 g | 3.00 g | 0 g |
| Low-molecular hydrophilic compound (1) | 0.54 g | 0.54 g | 0.54 g | 0.54 g | 0.54 g | 0.54 g |
| Sensitizer (1) | 0.38 g | 0.38 g | 0.38 g | 0.38 g | 0.38 g | 0.38 g |
| Fluorine surfactant (1) | 0.04 g | 0.04 g | 0.04 g | 0.04 g | 0.04 g | 0.04 g |
| Microcapsule (1) (21.8% by mass-aqueous solution) | 17.88 g | 17.88 g | 17.88 g | 17.88 g | 17.88 g | 17.88 g |
| Methylethylketone | 27.64 g | 27.64 g | 27.64 g | 27.64 g | 27.64 g | 27.64 g |
| Propylene glycol monomethyl ether | 76.00 g | 76.00 g | 76.00 g | 76.00 g | 76.00 g | 76.00 g |
| Water | 20.57 g | 20.57 g | 20.57 g | 20.57 g | 20.57 g | 20.57 g |

The structures of the infrared absorbing agent (1), the polymerization initiator (1), the binder polymer (1), the low molecular hydrophilic compound (1), the sensitizer (1) and the fluorine surfactant (1) shown in Table 1 are as follows.

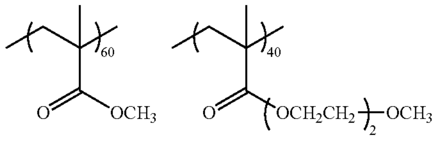

Binder polymer (1)

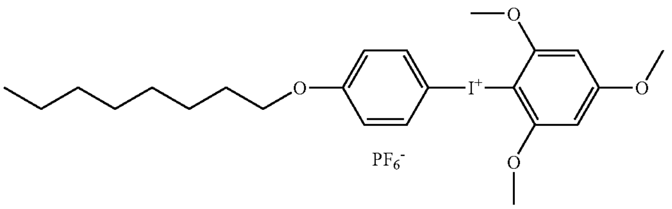

Polymerization initiator (1)

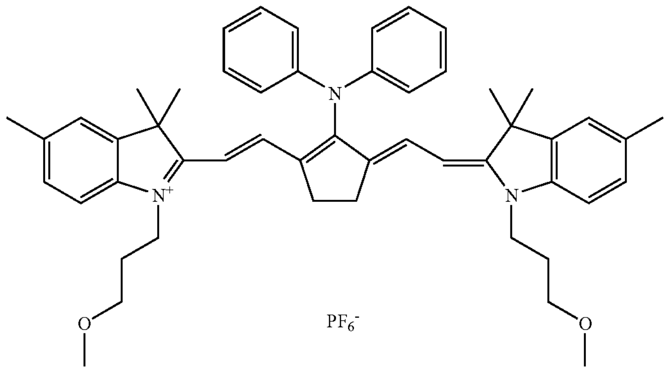

Infrared absorbing agent (1)

-continued

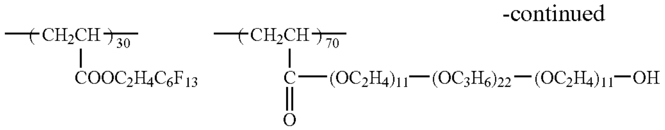

Fluorine surfactant (1)

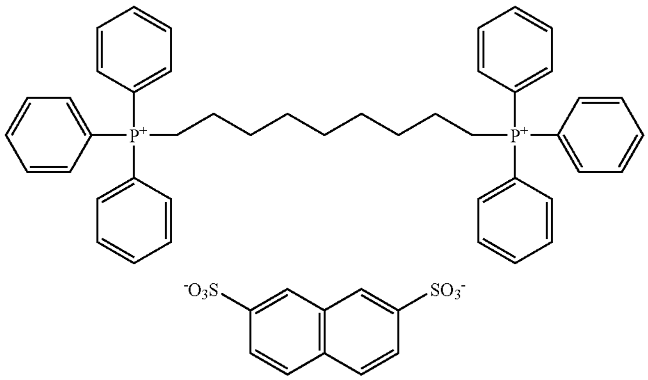

Sensitizer (1)

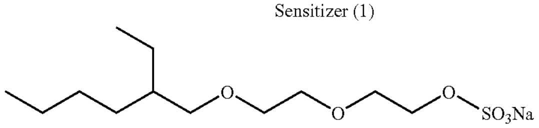

Low molecular hydrophilic compound (1)

The microcapsule (1) shown in Table 1 was synthesized as follows.

Synthesis of Microcapsule (1)

4.46 g of polyfunctional isocyanate having the following structure (manufactured by Mitsui Chemicals Polyurethanes, Inc., 75%-ethyl acetate solution), 0.86 g of trimethylolpropane, xylene diisocyanate and methyl-terminal polyoxyethylene adduct (manufactured by Mitsui Chemicals Polyurethanes, Inc., 50%-ethyl acetate solution), 1.72 g of pentaerythritol tetraacrylate (trade name: SR399E, manufactured by Sartomer Company, Inc.) and 0.05 g of PAIONIN A-41C (trade name, manufactured by Takemoto Oil & Fat Co., Ltd., 70%-methanol solution) as oil phase components were dissolved in 4.46 g of ethyl acetate. The oil phase components and 17.30 g of water as an aqueous phase component were mixed and emulsified at 10,000 rpm for 15 minutes by using a homogenizer. The obtained emulsion was stirred at temperature of 40° C. for 4 hours. The microcapsule solution thus obtained was diluted with water so that the solid content concentration thereof became 21.8% by mass. The average particle diameter of the thus obtained microcapsule was 0.25 μm.

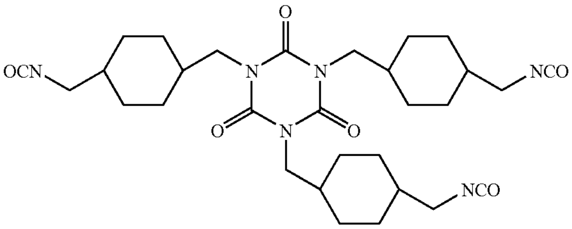

Polyfunctional isocyanate

Formation of Overcoat Layer

Subsequently, a coating liquid for forming an overcoat layer having the following formulation was subject to bar coating on the image recording layer, and thereafter to oven drying at temperature of 125° C. for 75 seconds to form an overcoat layer having a dry coating amount of 0.15 $g/m^2$.

Thus, planographic printing plate precursors of Examples 1 to 5 and Comparative Example 1 were obtained.

| Formulation of Coating liquid for forming overcoat layer | |
|---|---|
| Polyvinyl alcohol (trade name: PVA-405, manufactured by Kuraray Co., Ltd.) (saponification degree of 81.5 mol %, polymerization degree of 500) | 0.16 g |
| Denatured polyvinyl alcohol having a sulfonic acid at a terminal thereof (trade name: CKS-50, manufactured by Nippon Synthetic Chemical Industry Co., Ltd.) | 0.49 g |
| Surfactant (trade name: EMALEX710, manufactured by Nihon Emulsion Co., Ltd.) | 0.13 g |
| Synthetic mica (trade name: SOMASIV MEB-3L, manufactured by CO-OP Chemical Co., Ltd., 3.2% by mass-aqueous solution) | 22.28 g |
| Water | 52.54 g |

2. Exposure and Printing

The obtained planographic printing plate precursors were exposed on the conditions of an output of 9 W, an exterior drum rotation number of 210 rpm and a resolution of 2400 dpi by Trendsetter 3244VX (trade name, manufactured by Creo Company, Inc.) having a water cooling type 40 W-infrared semiconductor laser mounted therewith. The printing plates obtained by the exposure were installed in a cylinder of a painting press (trade name: SPRINT 25, manufactured by Komori Corporation) without performing development process. A dampening water (trade name: ECOLITY-2, manufactured by Fujifilm Corporation, 2% by volume-aqueous solution) was first supplied from a dampening roller to the printing press by 5 rotations of the cylinder, and thereafter a black ink (trade name: FUSION-G (N), manufactured by Dainippon Ink and Chemicals Inc.) was continuously supplied from an inking roller by 3 rotations of the cylinder while continuing the supply of the dampening water to thereafter start printing.

3. Evaluations

The on-press development was performed as described above and the printing was continued at a printing speed of 8,000 sheets per hour. As a result, favorable printed matters with no dirt in non-image portions were finally obtained. The number of sheets at which a printed matter with no dirt in non-image portions was obtained was evaluated as on-press developability.

The printing press was stopped at the time when 500th printed sheet was obtained to evaluate a condition of adhesion of removed sediments on the dampening roller. The criteria were as follows.

A: No sediment was observed on the dampening roller.

B: A little amount of sediments was observed on the dampening roller.

X: Large amount of sediments was observed on the dampening roller.

Further, the printing was restarted and continued after evaluating the condition of adhesion of removed sediments on the dampening roller. The printing of a greater number of sheets caused gradual wearing of the image recording layer to decrease in ink-receiving capacity to lead to decrease in the ink densities of printed images on the printed paper. The printing durability of the plate was evaluated in terms of the number of sheets printed until the ink density (reflection density) of the printed image was decreased by 0.2 from that obtained at the time that the printing was started. These results are summarized in Table 2.

In addition, a planographic printing plate precursor of Reference example 1 was prepared, subjected to printing and evaluated in the same manner as Comparative example 1, except that the dampening water was first supplied from the dampening roller to the printing press by 20 rotations of the cylinder in place of that supplied by the 3 rotations of the cylinder.

As is clearly understood from Table 2, the planographic printing plate precursors of the invention (Examples 1 to 5) are extremely superior in on-press developability to those of a conventional planographic printing plate precursor (Comparative Example 1) while maintaining printing durability. It is also understood that the planographic printing plate precursors of the invention are excellent in prevention of adhering of removed sediments on a dampening roller.

Further, there is no substantial difference between the on-press developability of Examples 1 to 5 and that of Reference Example 1, which was subjected to printing in a state where a large amount of dampening water was supplied. This result indicates that the planographic printing plate precursors of the invention may provide favorable on-press developability even in the case where the amount of dampening water supplied thereto is smaller.

Examples 6 to 11 and Comparative Examples 2 and 3

Planographic printing plate precursors of Examples 6 to 11 were prepared in the same manner as Example 2, except that the component (D), that is the tris(2-hydroxyethyl)isocyanurate, contained in the coating liquid for forming the image forming layer was changed to any one of (D-1) to (D-5) and (D-8) to (D-10), which are shown in the above as the specific examples of the specific development promoting agent represented by Formula (I). Further, planographic printing plate precursors of Comparative examples 2 and 3 were prepared in the same manner as Example 2, except that the component (D), that is the tris(2-hydroxyethyl)isocyanurate, contained in the coating liquid for forming the image forming layer was changed to the Comparative compounds (1) or (2) shown in the following.

The configurations and results of evaluations of Examples 6 to 11 and Comparative examples 2 and 3 are shown in the following Table 3 together with those of Example 2.

Comparative compound (1)

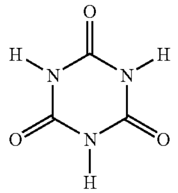

Comparative compound (2)

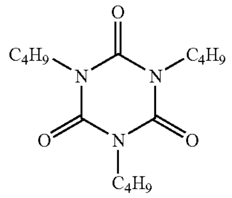

TABLE 2

| | Coating liquid for Image forming layer | On-press developability | Printing durability | Adhesion condition of sediments removed from image forming layer and adhered on dampening roller |
|---|---|---|---|---|
| Example 1 | coating solution 1 | 50 sheets | 25,000 sheets | A |
| Example 2 | coating solution 2 | 30 sheets | 25,000 sheets | A |
| Example 3 | coating solution 3 | 20 sheets | 22,000 sheets | A |
| Example 4 | coating solution 4 | 15 sheets | 20,000 sheets | A |
| Example 5 | coating solution 5 | 10 sheets | 20,000 sheets | A |
| Comparative Example 1 | coating solution 6 | 100 sheets | 20,000 sheets | B |
| Reference Example 1 | coating solution 2 | 50 sheets | 20,000 sheets | A |

TABLE 3

| | (D) component or Comparative compound | On-press developability | Printing durability | Adhesion condition of sediments removed from image forming layer and adhered on dampening roller |
|---|---|---|---|---|
| Example 2 | (D-1) | 30 sheets | 25,000 sheets | A |
| Example 6 | (D-2) | 40 sheets | 22,000 sheets | A |
| Example 7 | (D-3) | 50 sheets | 20,000 sheets | A |
| Example 8 | (D-5) | 35 sheets | 22,000 sheets | A |
| Example 9 | (D-8) | 40 sheets | 20,000 sheets | A |
| Example 10 | (D-9) | 45 sheets | 22,000 sheets | A |
| Example 11 | (D-10) | 35 sheets | 20,000 sheets | A |
| Comparative Example 2 | Comparative compound (1) | 80 sheets | 10,000 sheets | B |
| Comparative Example 3 | Comparative compound (2) | 100 sheets | 20,000 sheets | B |

As is clearly understood from Table 3, the planographic printing plate precursors of the invention (Examples 6 to 11) are extremely superior in on-press developability and printing durability to those of conventional planographic printing plate precursors (Comparative Examples 2 and 3). It is also understood that the planographic printing plate precursors of the invention are excellent in prevention of adhering of removed sediments on a dampening roller.

What is claimed is:

1. A planographic printing plate precursor comprising: a support; and an image recording layer that is provided on the support and is configured to form an image as a result of supply of printing ink and dampening water at a printing press and removal of an unexposed portion after exposure, the image recording layer comprising: an infrared ray absorbing agent (A); a polymerization, initiator (B); a polymerizable compound (C); and a compound (D) represented by the following Formula (I):

Formula (I)

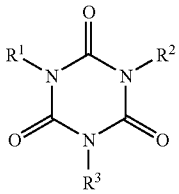

wherein, in Formula (I), at least one of $R^1$ to $R^3$ represents —$(CH_2CH_2O)_n$—$R^4$, while the remainder of $R^1$ to $R^3$ respectively independently represent a hydrogen atom, an alkyl group having 1 to 4 carbon atoms, or $R^5$—COOH; $R^4$ represents a hydrogen atom or an alkyl group having 1 to 4 carbon atoms; n represents an integer of 1 to 20; and $R^5$ represents an alkylene group having 1 to 6 carbon atoms.

2. The planographic printing plate precursor of claim 1, wherein at least two of $R^1$ to $R^3$ in Formula (I) respectively represent —$(CH_2CH_2O)_n$—$R^4$.

3. The planographic printing plate precursor of claim 1, wherein $R^1$ to $R^3$ in Formula (I) respectively represent —$(CH_2CH_2O)_n$—$R^4$.

4. The planographic printing plate precursor of claim 1, wherein the content of the compound (D) represented by Formula (I) in the image recording layer is 1 to 20% by mass of the total solid content of the image recording layer.

5. The planographic printing plate precursor of claim 1, wherein the image recording layer further comprises a polymerizale compound having an isocyanuric acid structure.

6. The planographic printing plate precursor of claim 1, wherein the content of the compound(D) represented by Formula (I) in the image recording layer is 1 to 20% by mass of the total solid content of the image recording layer, and the image recording layer further comprises a polymerizable compound having an isocyanuric acid structure.

7. The planographic printing plate precursor of claim 1, wherein the compound (D) represented by Formula (I) is one selected from the group consisting of the following (D-1) to (D-10):

(D-1)

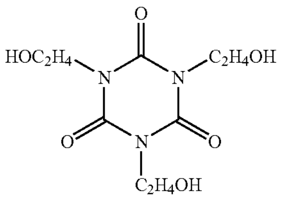

(D-2)

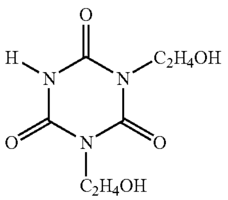

(D-3)

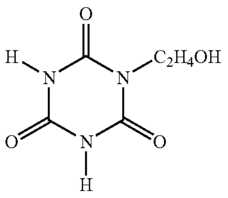

(D-4)

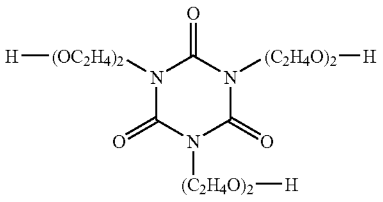

(D-5)

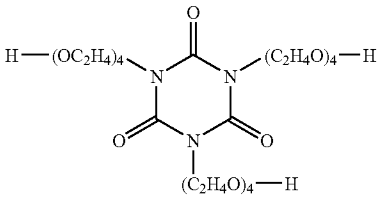

-continued (D-6)

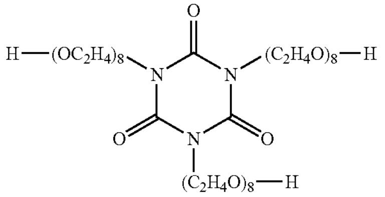

(D-7)

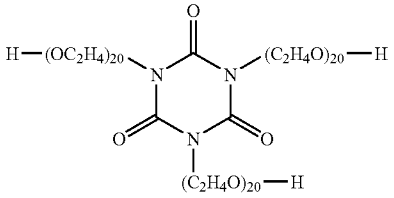

(D-8)

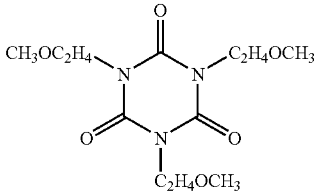

(D-9)

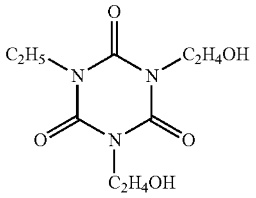

(D-10)

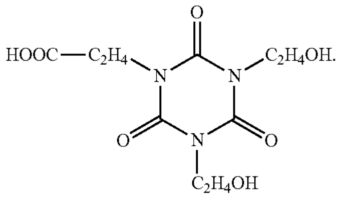

8. The planographic printing plate precursor of claim 7, wherein the content of the compound (D) represented by Formula (I) in the image recording layer is 1 to 20% by mass of the total solid content of the image recording layer.

9. The planographic printing plate precursor of claim 7, wherein the image recording layer further comprises a polymerizable compound having an isocyanuric acid structure.

10. The planographic printing plate precursor of claim 7, wherein the content of the compound (D) represented by Formula (I) in the image recording layer is 1 to 20% by mass of the total solid content of the image recording layer, and the image recording layer further comprises a polymerizable compound having an isocyanuric acid structure.

11. A printing method comprising:

providing the planographic printing plate precursor of claim 1;

imagewise exposing and mounting the planographic printing plate precursor on a printing press, wherein the exposing is performed either before or after the mounting;

supplying printing ink and dampening water and performing on-press development of the exposed planographic printing plate precursor so as to form a planographic printing plate having an image formed by removing an unexposed portion of the image recording layer; and printing using the planographic printing plate.

12. The printing method of claim 11, wherein the content of the compound (D) represented by Formula (I) in the image recording layer is 1 to 20% by mass of the total solid content of the image recording layer.

13. The printing method of claim 11, wherein the image recording layer further comprises a polymerizable compound having an isocyanuric acid structure.

14. The printing method of claim 11, wherein the content of the compound (D) represented by Formula (I) in the image recording layer is 1 to 20% by mass of the total solid content of the image recording layer, and the image recording layer further comprises a polymerizable compound having an isocyanuric acid structure.

15. The printing method of claim 11, wherein the exposing is performed before the mounting.

16. The printing method of claim 15, wherein the content of the compound (D) represented by Formula (I) in the image recording layer is 1 to 20% by mass of the total solid content of the image recording layer.

17. The printing method of claim 15, wherein the image recording layer further comprises a polymerizable compound having an isocyanuric acid structure.

18. The printing method of claim 15, wherein the content of the compound (D) represented by Formula (I) in the image recording layer is 1 to 20% by mass of the total solid content of the image recording layer, and the image recording layer further comprises a polymerizable compound having an isocyanuric acid structure.

19. The planographic printing plate precursor of claim 1, wherein $R^4$ represents a hydrogen atom or a methyl group.

20. The printing method of claim 11, wherein $R^4$ represents a hydrogen atom or a methyl group.

* * * * *